United States Patent [19]

Jeuch et al.

[11] Patent Number: 4,849,369
[45] Date of Patent: Jul. 18, 1989

[54] METHOD OF MAKING AN EPROM MEMORY CELL

[75] Inventors: Pierre Jeuch, Seyssins; Michel Heitzmann, Brignoud, both of France

[73] Assignee: Commissariat a l'Energie Atomique, Paris, France

[21] Appl. No.: 87,460

[22] Filed: Aug. 20, 1987

[30] Foreign Application Priority Data

Aug. 21, 1986 [FR] France .................. 86 11947

[51] Int. Cl.⁴ .................. H01L 21/225; H01L 21/26
[52] U.S. Cl. .................. 437/43; 437/40; 437/44; 437/48; 437/50; 437/49; 437/51; 437/52; 437/61; 437/69; 437/191; 437/195; 437/228
[58] Field of Search .......... 437/43, 48, 49, 50, 437/51, 52, 61, 69, 44, 191, 195, 228; 357/45, 235

[56] References Cited

U.S. PATENT DOCUMENTS 3,893,152 7/1975 Lin .................. 437/51
4,151,021 4/1979 McElroy .................. 437/48
4,258,466 3/1981 Kuo et al. .................. 437/48

FOREIGN PATENT DOCUMENTS 0109853 11/1983 European Pat. Off. .
3103143 1/1980 Fed. Rep. of Germany .
2523354 3/1983 France .
2060999 10/1979 United Kingdom .

Primary Examiner—Brian E. Hearn
Assistant Examiner—Tom Thomas
Attorney, Agent, or Firm—Nutter, McClennen & Fish

[57] ABSTRACT

An a MIS integrated circuit, such as an EPROM memory cell integrated onto a semiconductor substrate comprises (a) memory points which are insulated from one another and have in each case a stack of materials formed from a first insulant in contact with the substrate, first and second gates separated from one another by a second insulant, the first gate being in contact with the first insulant, a source and a drain formed in the substrate on either side of the stack of gates, and a channel, whose length is oriented according to a first direction Y, (b) first metal lines parallel to the first direction for applying electric signals to said stacks and (c) second conductor lines parallel to a second direction X perpendicular to the first direction and produced on the drains for applying electric signals to said drains. A process for making the circuit is also disclosed.

23 Claims, 14 Drawing Sheets

FIG. 8
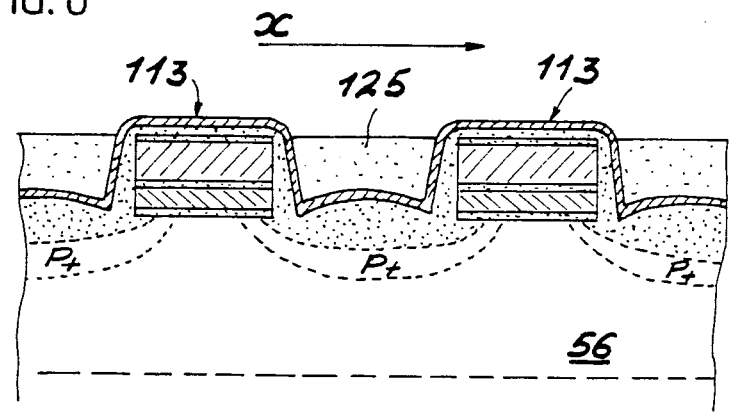
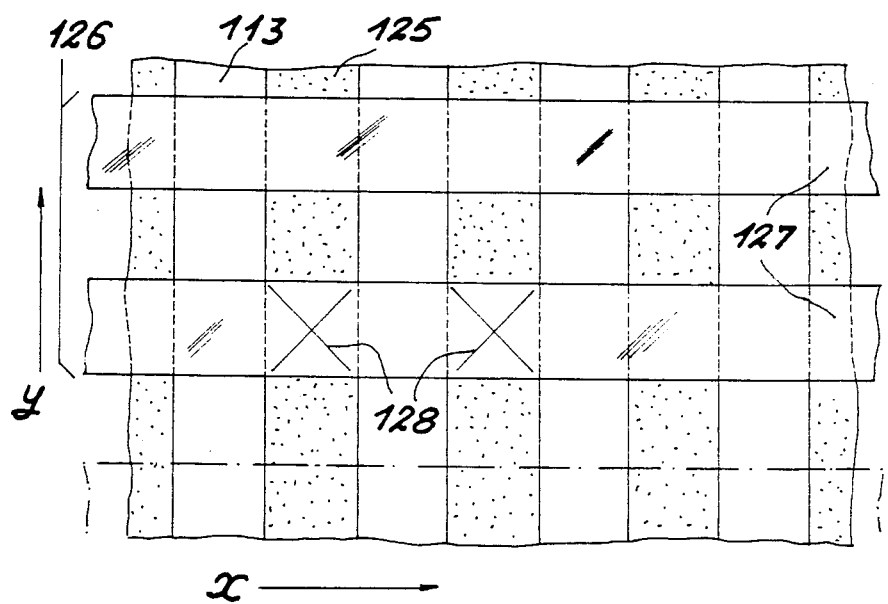
FIG 9

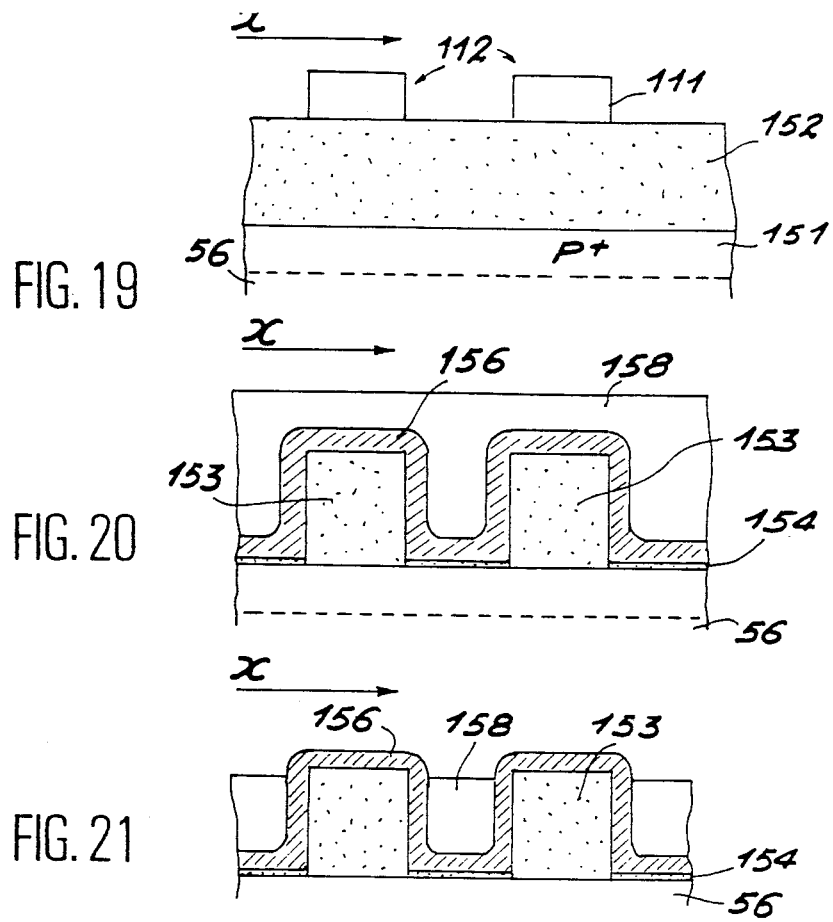
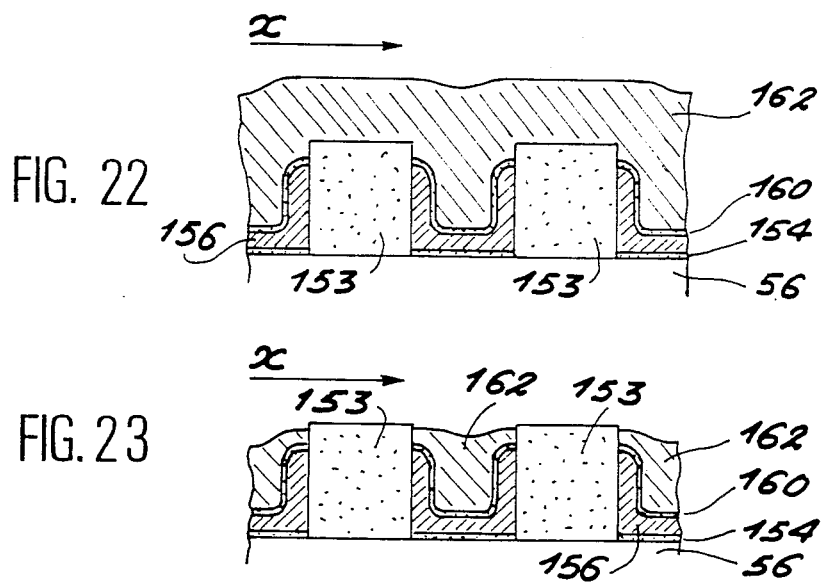
FIG. 19
FIG. 20
FIG. 21
FIG. 22
FIG. 23

METHOD OF MAKING AN EPROM MEMORY CELL

BACKGROUND OF THE INVENTION

The present invention relates to a MIS integrated circuit, as well as to its manufacturing process. It more particularly applies in the field of the manufacture of integrated memory circuits of the MOS or CMOS type and more particularly to non-volatile memories of the EPROM, EEPROM and ROM type.

An integrated memory is an integrated circuit incorporating the actual memory part, called the memory cell, which is formed from several electrically interconnected memory points and peripheral circuits used for controlling the memory points. The invention relates solely to the actual memory part and to its manufacture.

The most modern floating grid or gate EPROM memory cells make it possible to store $10^6$ bits, which now have surfaces of 20 to 25 $\mu m^2$ in a 1.2 $\mu m$ technology, i.e. in which the smallest strips and spaces are 1.2 $\mu m$. Thus, the surface of a memory is approximately 14 to 17 times the elementary lithography square ($1200 \times 1200$ $nm^2$).

FIG. 1 diagrammatically shows in perspective a known floating gate EPROM memory cell. As shown in FIG. 1, a memory point is formed from a transistor having a source 4 and a drain 6 produced in a monocrystalline silicon semiconductor substrate 8. The source and drain have reverse conductivities to those of the substrate.

The transistor also comprises a gate insulant 10, generally of silicon dioxide, on which are stacked a first gate 12 and a second gate 14, which are generally made from phosphorus-doped polycrystalline silicon. These two gates are separated by a fine insulant layer 16, which is generally of silicon dioxide. The first gate 12 is a floating gate and the second gate 14 the control gate of the memory point. This memory point is electrically insulated, by means a field oxide 18 produced by local surface oxidation of the substrate, from the other memory points, as well as peripheral control circuits of said memory point.

The complete memory cell is covered with a thick insulating layer 22, which is generally of silicon dioxide, in which are formed the electric contact holes for the sources and drains, such as 24. The electrical connections between these sources and drains of the different memory points and/or the different peripheral control circuits are realised by a conductive layer 26, which is generally of aluminium and which is deposited on insulating layer 24 and etched in appropriate manner.

The electrical connections between the control gates of the different memory points are defined at the same time as the control gates 14 and in the same polycrystalline silicon layer. They are consequently located below the interconnections for the sources and the interconnections for the drains.

Increasing attempts are being made to reduce the size of integrated circuits and in particular memories with a view to increasing their integration density. Unfortunately in the presently known EPROM memories two factors limit the reduction of the dimensions of such a memory cell.

The first factor is the projection 28 of the floating gate 12 above the field oxide 18. This projection is necessary due to the superimposing imprecision of the different layers constituting the memory points and lithography masks necessary for etching the different layers. This projection is in direction X of the lines of words (for connections of gates) of the memory cell, said direction being perpendicular to those of the channels of the memory points. In MIS circuits, the projection of the single gate of the transistors also occurs above the field oxide.

The second factor, which is in direction Y of the lines of bits and parallel to the direction of the channels of the memory points, is the need to provide insulating guards 30 around the contact holes of the bit line, i.e. around the contact holes of the drains of the memory points. This second limiting factor also exists in EEPROM and ROM memories and in general terms in any MIS integrated circuit.

In particular, in integrated circuits with polycrystalline silicon control gates, the drains and sources of the components are auto-positioned with respect to the gate as a result of an ion implantation using the gates as a mask. Thus, any intersection of a polycrystalline silicon strip and an active zone or doped zone of the substrate produces a MIS transistor. It is also not possible to intersect a "diffused" strip (n+ or p+) in the substrate acting as a connection for the sources and drains with a connection of the polycrystalline silicon gates.

In order to effect such intersections, it is necessary to use an insulating layer and a layer of metal conductor lines on said insulating layer, which takes up a large amount of space due to the need for bringing about contacts within said layer. Moreover, "diffused" strips in the substrate cannot in themselves constitute interconnection lines as a result of their high resistivity.

The reduction to the lithographic dimensions are not generally accompanied by a proportional improvement in the superimposing precisions of the different levels, particularly lithographic masking levels, so that the limiting factors referred to hereinbefore become increasingly disadvantageous for an increase in the integration density, especially of non-volatile memories.

Auto-alignment or auto-positioning processes avoiding the projection of the floating gate over the field oxide and/or insulating guards around the contact holes are consequently necessary for future generations of non-volatile memories.

Apart from integration density problems, the presently known non-volatile memories and EPROMs require, during programming corresponding to writing, the application of high voltages to the memory point control gate of approximately 12.5 V, in order to inject hot electrons, produced close to the drain, into the floating gate. The use of such high programming voltages is consequently a constraint for the design of peripheral circuits for controlling the memory cell.

SUMMARY OF THE INVENTION

The present invention relates to a MIS integrated circuit and to its manufacturing process more particularly making it possible to obviate the various aforementioned disadvantages. In the special application to a memory cell, the latter has in particular an auto-alignment or auto-positioning of an integral nature for all the constituent elements of these memory points, which leads to a memory surface only representing 4 to 5 times the minimum lithographic surface. Moreover, a memory cell according to the invention is not limited to micron technology and can be produced by submicron technology. In addition, it has improved electrical performances. Thus, the access time of the cell during programming is reduced and the writing voltage is also reduced. It is possible to envisage the use of the same voltage for writing and reading and this voltage is approximately 5 V.

Thus, in general terms the invention relates to an integrated circuit on a semiconductor substrate, comprising (a) a group of transistors insulated electrically and laterally with respect to one another, each transistor comprising a first stack of materials formed from a first insulant, in contact with the substrate, and at least one gate in contact with the first insulant, a source and a drain formed in the substrate on either side of the stack and a channel, located in the substrate beneath said stack, whose length is oriented in a first direction passing from the source to the drain, (b) first longitudinally axed conductor lines parallel to a second direction for applying first electric signals to said stacks, (c) second longitudinally axed conductor lines parallel to a third direction for applying second electric signals to the drains and (d) third longitudinally axed conductor lines parallel to the third direction for applying third electric signals to the sources, wherein the second direction coincides with the first direction, the third direction is perpendicular to the first direction and the second and third conductor lines are respectively produced on the drains and sources.

In the inventive circuit, the interconnection lines of the drains and the interconnection lines of the sources used for applying appropriate control signals are directly and respectively produced on the drains and sources and consequently below the interconnection lines of the gates, which is contrary to the prior art. This avoids contacting on the sources and drains by etching an insulating layer surmounting the interconnection lines of the gates, while improving the electrical contact between the active zones and the interconnection lines of said active zones.

Although the invention applies to all integrated circuits having several MIS transistors, it is perfectly adapted to non-volatile memories having a floating gate MIS transistor matrix.

The invention consequently also relates to an integrated memory cell on a semiconductor substrate having (a) a group of memory points which are insulated electrically and laterally with respect to one another, each memory point comprising a first stack of materials formed from a first insulant, in contact with the substrate, first and second gates, separated from one another by a second insulant, the first gate being in contact with the first insulant, a source and a drain formed in the substrate on either side of the stack of gates, and a channel, located in the substrate beneath said stack and whose length is oriented in a first direction passing from the source to the drain, (b) first longitudinally axed conductor lines parallel to a second direction for applying first electric signals to said stacks, (c) second longitudinally axed conductor lines parallel to a third direction, perpendicular to the second direction for applying second electric signals to the drains and (d) third longitudinally axed conductor lines parallel to the third direction for applying third electric signals to the sources, wherein the second direction coincides with the first direction, the third direction is perpendicular to the first direction and the second and third conductor lines are respectively produced on the drains and sources of the memory points.

In other words, the first conductor lines corresponding to the lines of words for a memory cell, are parallel to the length of the transistors or memory points and the second conductor lines, corresponding for a memory cell to the lines of bits, are perpendicular to the length of the transistor channels. This contributes to eliminating the insulating layer in which are defined the electric contact holes of the sources and drains of the transistors or memory points and consequently insulating guards around said contact holes, thus considerably reducing the dimensions of the integrated circuit.

Preferably, the first conductor lines are made from metal and independently of the control gates (single gate for a single MIS transistor or second gate for a transistor having a floating gate) and therefore from different materials. Inter alia, this makes it possible to produce these first conductor lines following the production of the sources and drains by ion implantation followed by annealing and consequently the use of a metal having a tendency to deteriorate during annealing, such as aluminium.

The use of aluminium for the interconnection of the control gates offers major advantages as a result of its low resistivity and low cost compared with that of refractory metals (Ti, W, Ta).

The second and third conductor lines are e.g. made from metal or a silicide of a refractory metal.

In the particular case of floating gate transistors, the first and second gates of said transistor do not extent above lateral insulations used for electrically insulating the transistors from one another and are auto-aligned or auto-positioned with respect to said insulations, which further contributes to the reduction of the dimensions of the MIS integrated circuit. In the same way, the single gate of single MIS transistors does not extend above these insulations.

In the particular case of a memory cell comprising floating gate transistors, the electrical performances of the cell are dependent on the value of the coupling capacitance between the floating gate and the control gate of the memory points. In particular, the ratio of said capacitance to that defined between the floating gate and the substrate fixes the voltage which is to be applied to the floating gate for a given control gate voltage. This is in particular prejudicial during writing into the memory through imposing a high writing voltage.

In order to reduce the writing voltage, the first or floating gate advantageously is shaped like a U along a section parallel to the third direction and consequently to the longitudinal axis of the connection lines of the drains of the memory points. This U shape particularly increases the coupling surface between the two gates, but without increasing the overall dimensions of the cell.

Coupling can be further increased by using a dish-shaped floating gate, whereof the bottom defines the channel and whereof the sides rise vertically. In other words, the floating gates is shaped like a U in accordance with a section parallel to the third direction and simultaneously in accordance with a section parallel to the second direction. The control gate fills and covers said dish.

The invention also relates to a process for the manufacture of an integrated circuit on a semiconductor substrate having (a) a group of transistors electrically insulated from one another by lateral insulations, each transistor comprising at least one gate, a source and drain located on either side of the gate and a channel located beneath the gate, (b) first conductor lines for applying first electric signals to the gates, (c) second conductor lines for applying second electric signals to the drains and (d) third conductor lines for applying third electric signals to the sources, wherein it only has three lithographic masking levels, a first mask for simultaneously defining the width of the channels and the length of the lateral insulations, a second mask for simultaneously defining the width of the lateral insulations and the length of the channels and a third mask for defining the first conductor lines.

Apart from the advantages referred to hereinbefore, the process according to the invention provides significant simplifications compared with the known process by in particular reducing the number of lithographic masks (e.g. photolithographic masks) made from resin necessary for producing transistors. Thus, three lithographic masking levels instead of six are sufficient for producing the memory points.

Apart from the simplification of the process, the reduced number of lithographic masks is advantageous for the efficiency of the mass production of the memory points, e.g. EPROM.

Advantageously, the first, second and third masks are each formed from parallel linear strips, which have a constant width and are equidistant, the strips of the first and third masks being perpendicular to those of the second mask.

According to a first embodiment of the process according to the invention, the lateral insulations of the MIS circuit are produced after having defined the width of the channels and therefore the length of the gates.

In this first embodiment, it is advantageous to perform the following stages:

(1) successive depositions on the substrate of a layer of at least one first insulating material and at least one layer of a second conductive material, (2) production of the first mask, (3) elimination of the regions of the second and optionally first materials not masked by the first mask, thus forming first overhanging strips parallel to a first direction, (4) elimination of the first mask, (5) filling the spaces defined between the first strips by a third insulating material constituting the lateral insulations, (6) producing the second mask, (7) elimination of the regions of the third, second and possibly first materials not masked by the second mask, thus forming second overhanging strips parallel to a second direction perpendicular to the first direction, (8) production of sources and drains by a doping of the substrate having a reverse conductivity to that of the substrate, (9) elimination of the second mask,

(10) production of insulating spacers on either side of the second strips and joined to the latter,

(11) production of second conductor lines in the spaces defined between the spacers, the height of the second lines being less than that of the second strips and the spacers,

(12) covering the second conductor lines by a fourth insulating material level with the top of the second strips,

(13) deposition of a layer of a fifth conductive material over the entire structure obtained,

(14) production of the third mask,

(15) elimination of the regions of the fifth material not masked by the third mask, thus forming first conductor lines and,

(16) elimination of the third mask.

According to another embodiment of the process according to the invention, the lateral insulations are produced before defining the width of the channels and therefore the length of the gates. This embodiment is completely suitable for producing a memory cell, whose memory points have a floating gate and a control gate which are insulated from one another. In this particular case, the second process according to the invention advantageously comprises the following stages:

(I) deposition of a first layer of a first insulating material on the complete substrate for forming lateral insulations, (II) production of the first mask, (III) elimination of the regions of the first material not masked by the first mask, thus forming first overhanging strips parallel to a first direction, (IV) elimination of the mask, (V) deposition of a second insulating material between the first strips, (VI) successive depositions solely on the second material of a third conductive material, of a fourth insulating material and a fifth conductive material, the height of the stack of the second, third, fourth and fifth materials being close to that of the first strips, (VII) production of the second mask, (VIII) elimination of the regions of the fifth, fourth, third and possibly second materials not masked by the second mask, thus forming second overhanging strips parallel to a second direction perpendicular to the first direction.

(IX) production of sources and drains by a first doping of the substrate having a reverse conductivity to that of the substrate, (X) elimination of the second mask, (XI) production of insulating spacers on either side of the second strips and joined to the latter, (XII) production of second conductor lines in the spaces defined between the spacers, the height of the second lines being less than that of the second strips and the spacers, (XIII) covering the second conductor lines by a sixth insulating material level with the top of the second strips, (XIV) deposition of a layer of a seventh conductive material over the entire structure obtained, (XV) production of the third mask, (XVI) elimination of the regions of the seventh material not masked by the third mask, thus forming the first conductor lines and, (XVII) elimination of the third mask.

This second embodiment is slightly simpler than the first.

Moreover, the capacitive coupling between the control gate and the floating gate is improved, the coupling surface being larger.

BRIEF DESCRIPTION OF THE DRAWINGS

The invention is described in greater detail hereinafter relative to non-limitative embodiments and the attached drawings, wherein show:

FIGS. 4 to 15, diagrammatically the different stages of the process for the production of an EPROM memory point : FIGS. 4 to 8, 14 and 15 being sections in direction X of said cell, FIG. 9 a plan view and FIGS. 10 to 13 sections in direction Y of the cell.

FIGS. 19 to 23, diagrammatically, in direction X of the cell, another variant of the inventive process.

FIGS. 25 and 26 and parts A of FIGS. 29 and 30 being sections in direction Y of the cell, FIGS. 27, 28, 31, 32 and 33 perspective views and parts B of FIGS. 29 and 30 sections in direction X of the cell.

DETAILED DESCRIPTION OF THE INVENTION

The following description refers to an EPROM memory cell formed from memory points with a N channel produced on a type p monocrystalline silicon substrate. However, the invention also has a much broader scope, because it applies to any type of floating gate memory produced on a random semiconductor substrate.

Figure 1:
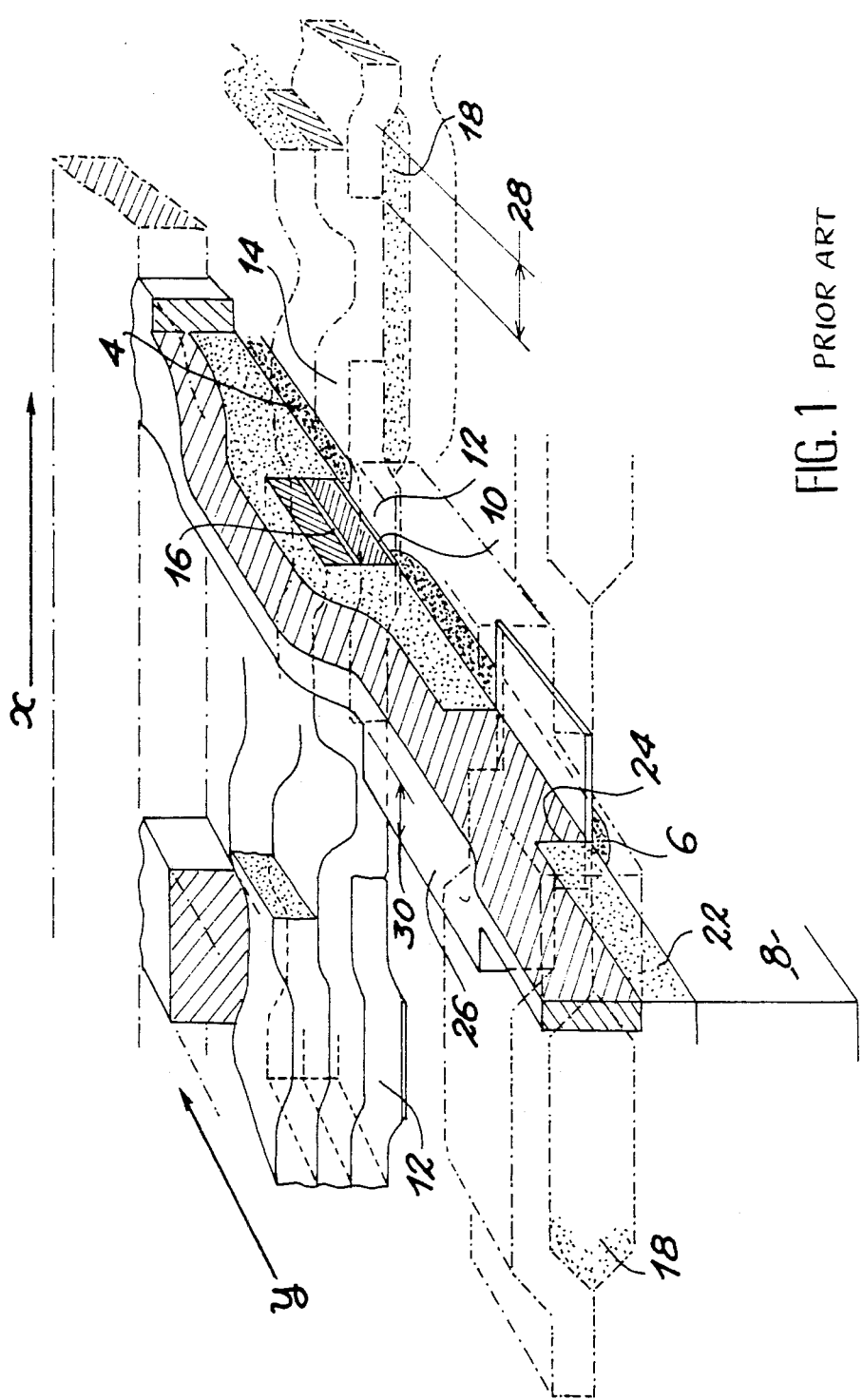
FIG. 1, already described, diagrammatically and in perspective, a prior art EPROM memory cell.
Figure 2:
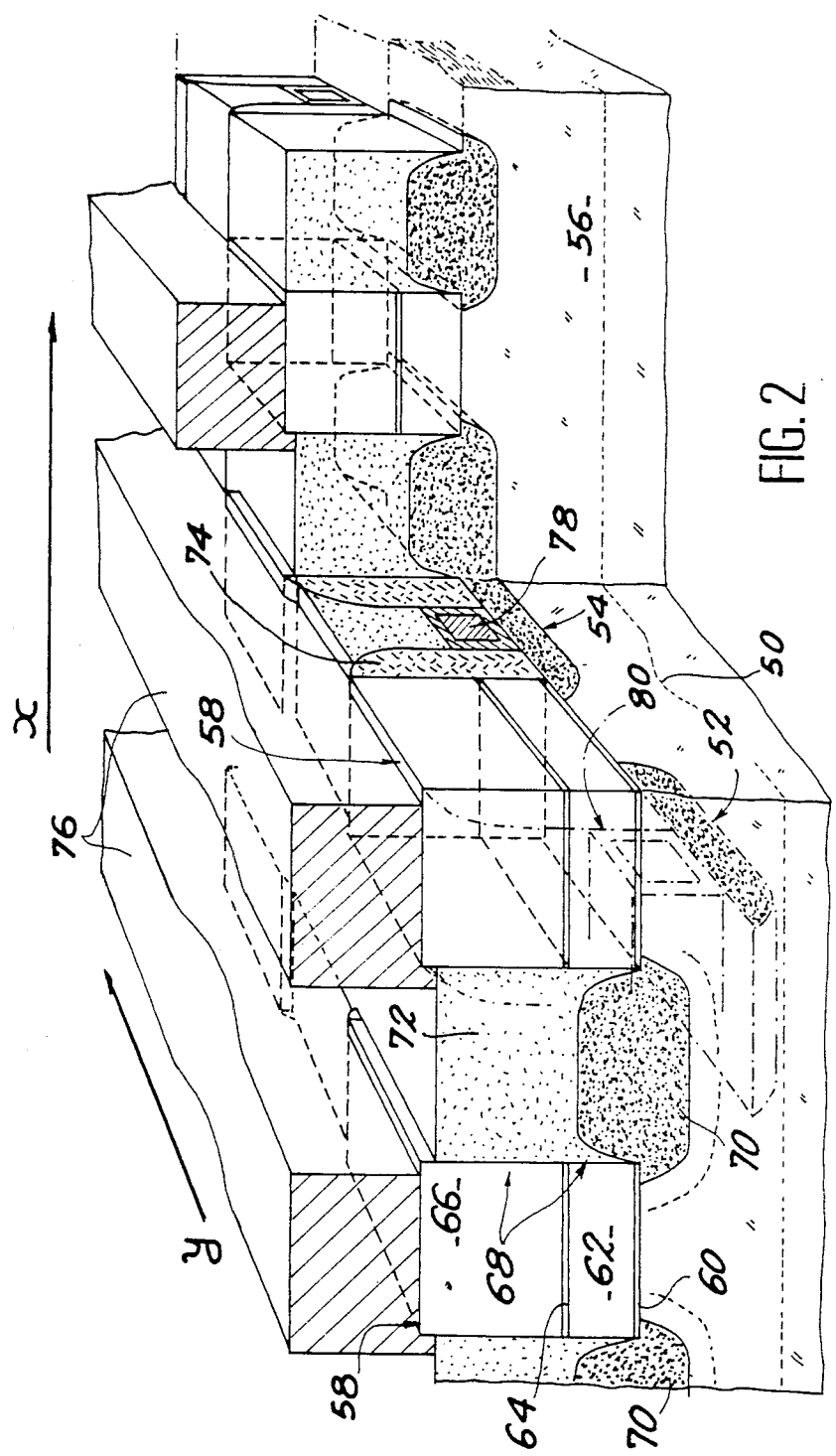
FIG. 2, diagrammatically and in perspective, an EPROM memory cell according to the invention.

The EPROM memory cell shown in FIG. 2 comprises, like the prior art memory cells, a matrix of memory points 50 formed from transistors, each of which has a source 52 and a drain 54 of the n+ type made from a type p monocrystalline silicon substrate 56. Stacks 58 of materials are provided between the sources and drains.

Starting from substrate 56, these stacks 58 are formed by a first silicon dioxide insulant 60, a phosphorus-doped polycrystalline silicon floating gate 62, a second insulant 64 formed from three stacked insulating materials $SiO_2$, $Si_3N_4$ and $SiO_2$ and a phosphorus-doped polycrystalline silicon control gate 66. These stacks are typically between 1000 and 1500 nm, as opposed to 600 to 700 nm in the prior art.

In order to reciprocally electrically insulate the memory points 50, lateral insulations 68 are provided. These insulations are accompanied by a p+ doping of the substrate and can be made from one or more stacked insulating materials, e.g. a local oxidation 70 of the substrate surmounted by a phosphorus-doped silicon dioxide ($SiO_2$) 72. In addition, $SiO_2$ spacers 74 are provided on either side of stacks 58. These spacers 74 are in the form of strips, oriented in direction X perpendicular to the length of the channels of the memory points passing from the source to the drain of said memory points.

According to the invention, floating gate 62 and control gate 66 of the different memory points have the same width and the same length. Moreover, these gates 62 and 66 do not extend above the lateral insulation 68 and are auto-aligned or auto-positioned with respect to said insulations.

According to the invention, the connection between the individual control gates 66, corresponding to the lines of words, is brought about by metal conductive strips 76, oriented parallel to direction Y of the memory points. Strips 76 can be made from aluminum, tungsten, gold, etc.

Moreover, the connection of the drains 54 of the memory points, corresponding to the bit lines, is brought about with the aid of conductive strips 78 parallel to a direction X, which is perpendicular to the metal connecting lines 76 of the gates and consequently the length of the channels of the memory points.

In the same way, the connection of the sources 52 of the memory points, corresponding to the supply lines for the latter, is brought about by conductive strips 80 parallel to the conductive strips 78 for connecting the drains.

The bit and supply lines are made from one or more metal layers (Al, W, TiW, MoTa, etc) or a silicide of a refractory metal, such as $TiSi_2$, $TaSi_2$, $MoSi_2$, or $WSi_2$.

For reading the content of a particular memory point, it is necessary to activate the corresponding supply line 80, the other supply lines not being polarized. This is necessary in view of the fact that two adjacent memory points separating the same bit line 78 are activated by the same word line 76. It is also possible to polarize all the word lines and to ground that of the selected memory point (reading).

Figure 3:
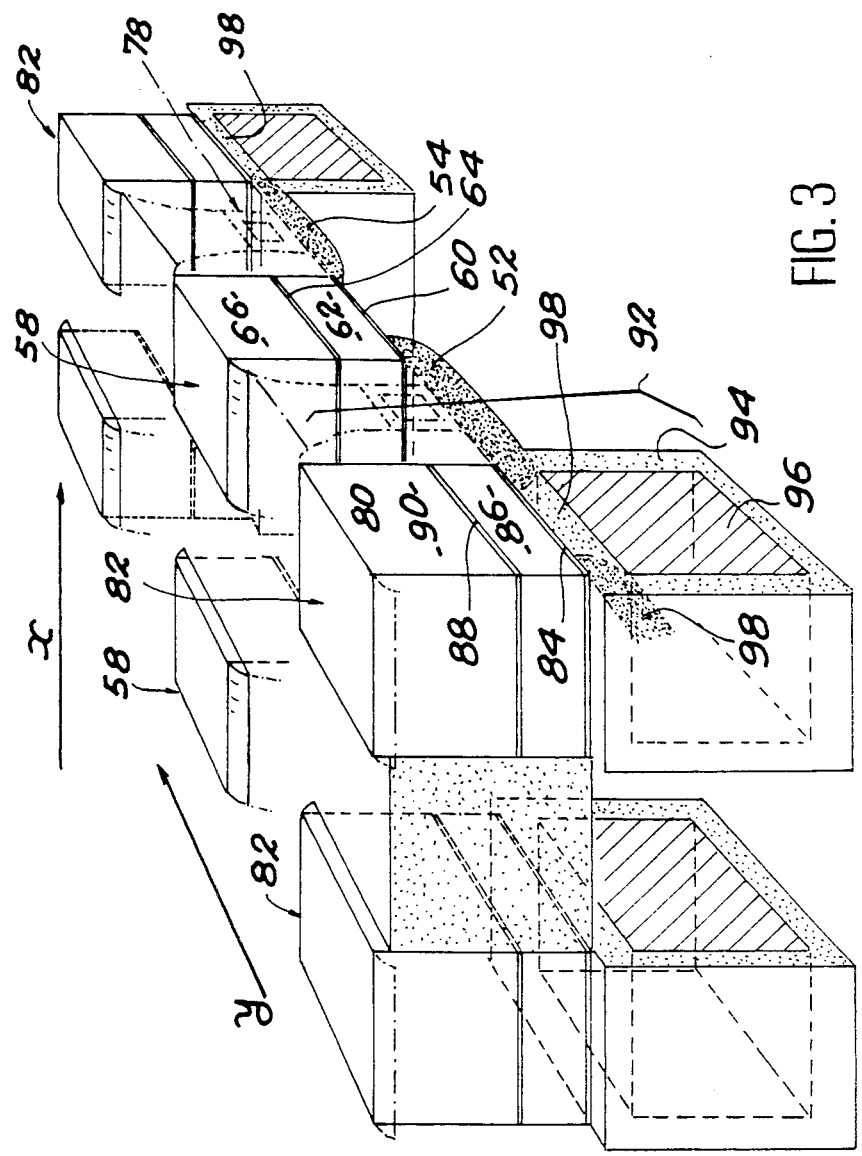
FIG. 3, a variant of the cell of FIG. 2.

In order to avoid a possible complication of the memory control circuits, as well as an access time loss for the same, it is possible to separate the bit lines 78 of two adjacent memory points. To this end, the memory cell according to the invention also comprises and as shown in FIG. 3, second stacks 82 of materials distributed in matrix-like manner like the memory points.

These second stacks are inserted between two adjacent memory points of the cell in direction Y. In all respects they are identical to stacks 58 and are in particular formed, starting from substrate 56, by a silicon dioxide insulant 84, a phosphorus-doped polycrystalline, silicon conductive material 86, a three-layer $SiO_2$-$Si_3N_4$-$SiO_2$ insulant 88 and a phosphorus-doped polycrystalline silicon conductive material 90. These second stacks are produced at the same time as the first stacks using the same photolithographic masks, the same layers of materials and the same etching stages.

According to the invention, an insulating trench 92 is provided beneath each second stack 82. These insulating trenches are produced in the substrate prior to any stage of the manufacture of the memory points, the lateral insulations and the connections of said memory points.

These insulating trenches 92 are obtained in known manner by firstly carrying out an anisotropic etching of the reactive ionic type of substrate 56 over a thickness of approximately 5000 nm using an appropriate photosensitive resin etching mask. This is followed by thermal oxidation of the edges of the trenches in order to form a film 94 on the sides and bottom of each trench and which is made from silicon dioxide. The trench is then filled with polycrystalline silicon 96. This filling operation is performed by chemical vapor phase deposition (CVD).

Following the elimination of the polycrystalline silicon located outside the trench, particularly by reactive ionic etching, there is a thermal oxidation of the surface of the silicon in order to form a $SiO_2$ layer 98 on the surface of the trench.

These insulating trenches can also be used for insulating CMOS peripheral circuits from the memory points.

Apart from these insulating trenches, the process for the production of this memory cell is unchanged compared with the process for the production of the memory cell without trenches. However, the surface of the memory cell is increased by 50%, but said increase makes it possible to obtain a memory cell with smaller dimensions than obtained by conventional processes.

With reference to FIGS. 4 to 15, a description will now be given of a first process for the manufacture of a memory cell according to the invention and as shown in FIG. 2.

Figure 4:
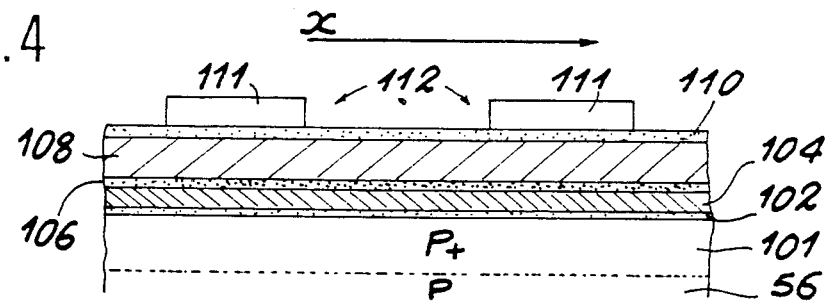

As shown in FIG. 4, this first process firstly consists of covering an e.g. p-type monocrystalline silicon semiconductor substrate 56 with a silicon dioxide ($SiO_2$) layer 102. The latter has a thickness of approximately 25 nm and is obtained by the thermal oxidation of the substrate at a temperature close to 900° C. Layer 102 will subsequently form the gate oxide of the memory points to be formed.

Through said silicon dioxide layer 102 is then effected a doping 101 of the substrate 56 for adjusting the threshold voltage of the memory points. This doping with a conductivity of the same type as the substrate can be obtained by implanting boron ions for a p-type substrate at a dose of $10^{12}$ ions/cm$^2$ and with an energy of 50 keV.

This is followed by the deposition of a phosphorus-doped polycrystalline silicon layer 104 by diffusion of $POCl_3$. Layer 104 deposited by a chemical vapor phase deposition process (CVD or LPCVD) has a thickness of 250 nm. In said layer 104 will subsequently be formed the first or floating gate of the memory points.

On layer 104 is then formed the inter-gate insulant 106, which can be obtained by the thermal insulation of the polycrystalline silicon of layer 104 at 900° C. over a thickness of 25 nm and then by depositing a 15 nm silicon nitride layer by CVD and surface oxidizing said nitride layer over a thickness of 5 nm by thermal oxidation at 900° C. It is possible to replace this complex insulant by a single silicon dioxide layer obtained by thermal oxidation at 900° C. of the polycrystalline silicon layer 104.

On insulant 106 is then deposited another polycrystalline silicon layer 108, phosphorus-doped by diffusion of $POCl_3$, in which will subsequently be formed the second or control gate of the memory points. This layer 108 can be obtained by chemical vapor, phase deposition (CVD or LPCVD) and has a thickness of 1000 nm.

This is followed by the deposition on layer 108 of a silicon nitride layer 110, e.g. by low pressure chemical vapor deposition (LPCVD). Layer 110 has a thickness of approximately 100 nm and protects the polycrystalline silicon layer 108 during the subsequent stages.

Using conventional photolithography processes, this is followed by the formation of a resin mask 112 making it possible to define the width of the channels and therefore the length of the floating gates and control gates of the memory points, as well as that of the lateral insulations.

In order to produce several memory points distributed in matrix-like manner on the surface of substrate 100, mask 112 is in the form of linear strips 111 which are parallel to one another and to direction Y and which correspond to the direction of the lines of bits. Strips 111 have a constant width and are equidistant. They are e.g. spaced by 1000 nm and have a width of 1000 nm.

Figure 5:
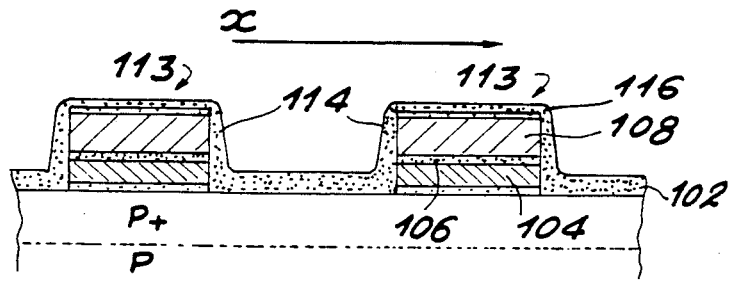

As shown in FIG. 5, this is followed by the elimination of the regions of the stacked different layers 110, 108, 106 and 104 not covered by resin 112, thus forming strips 113 of materials parallel to direction Y.

This elimination can be carried out by successive reactive ionic anisotropic etching operations using as the etching agent trifluoromethane ($CHF_3$) for the silicon nitride layers and sulphur hexafluoride ($SF_6$) for the polycrystalline silicon layers.

The use of different etching agents as a function of the nature of the layers, makes it possible to use the layer located below that which is etched as the etching blocking layer, this makes it possible to compensate thickness inhomogeneities of these different layers.

It is optionally also possible to etch the silicon dioxide layer 102 with the aid of a $CHF_3$ plasma and a limited thickness of substrate 56 with a view to subsequently producing a partly buried field oxide. The etching of substrate 100 can be carried out over a thickness of 400 nm by reactive ionic etching using $SF_6$ as the etching agent.

Figure 6:
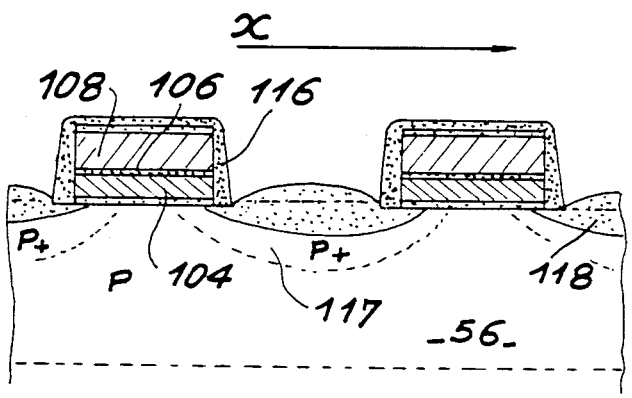

Following the elimination of the resin mask 112 by an oxygen plasma, as shown in FIG. 6, there is optionally an oxidation of the etched edged of strips 113 of the different layers 110–102 by approximately 30 nm at a temperature of 900° C. and under an oxygen atmosphere. The oxidized edges are 114.

This is followed by the deposition on the complete structure of an approximately 20 nm silicon nitride layer 116 using low pressure chemical vapor phase deposition. This is followed by full etching (i.e. without a mask) of the $Si_3N_4$ layer 116 using a plasma of $CHF_3$ and over a thickness of approximately 20 nm. Thus, silicon nitride is only left on the edges of etched stack 113 and on the top of said stack, as shown in FIG. 6.

This is followed by a doping of the substrate having a conductivity of the same type as that of the substrate. This doping can be carried out by boron ion implantation in the case of a p-type substrate, with an energy of 80 keV and at a dose of $10^{12}$ ions/cm$^2$. Between the stacks of etched layers, said doping makes it possible to obtain p+ regions 117.

This is followed by a thermal oxidation of the substrate over a thickness of approximately 500 nm, thus constituting a localized field oxide 118 used for the lateral insulation between the individual memory points. This thermal oxidation is not indispensable. However, its presence makes it possible to reduce the capacitances of the bit lines or the connections between the drains.

Figure 7:
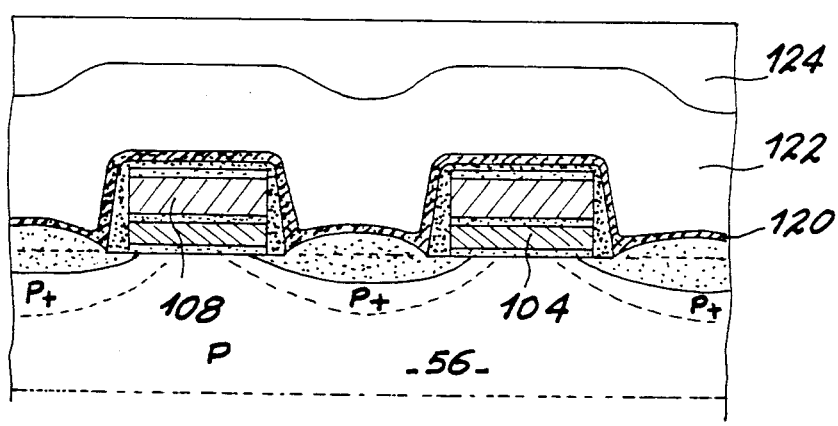

On the structure obtained is then deposited, as shown in FIG. 7, an approximately 50 nm thick silicon nitride layer 120. The latter can be deposited by low pressure chemical vapor phase deposition. The complete structure is then covered by a silicon dioxide layer 122 doped with phosphorus, e.g. 6% by weight phosphorus, using low pressure chemical vapor, phase deposition. Layer 122 has a thickness of approximately 1200 nm.

Layer 122 then undergoes a heat treatment, e.g. at a temperature of 1050° C. for 15 minutes, to bring about the flow and densification of said layer. In the absence of field oxide 118, insulating layer 122 serves as lateral insulation between the memory points.

In known manner, this is followed by the deposition of a photosensitive resin layer 124, which cancels out the relief of layer 122. This planarization resin layer 124 has a thickness of approximately 1500 nm. The deposition thereof can be followed by a heat treatment, e.g.

heating at a temperature of approximately 200° C. for 30 minutes, so as to obtain a good spreading of said resin layer.

This is followed by a simultaneous etching of resin layer 124 and oxide layer 122 at identical etching speeds in both cases until the surface of strips 113 of etched layers 104, 106, 108, 110 and 116 is exposed and as shown in FIG. 8. Thus, the height of the insulating strips 125 formed is close to that of the strips 113.

Said etching is e.g. carried out anisotropically by a reactive ionic etching process using as the etching agent a mixture trifluoromethane and tetrafluoromethane and oxygen. The fluorine compounds are used for the etching of silicon dioxide and oxygen for the etching of the resin.

As shown in FIG. 9, this is followed by producing a resin mask 126 making it possible to define the width of the gates of the elementary points and therefore the length of the channels. Mask 126 is in the form of linear strips 127 parallel to direction X.

The width of strips 127 is optionally equal to that of strips 111 of mask 112 in order to obtain floating and control gates having an identical width and length. These strips 127 of mask 126 have a length of 1000 nm and are spaced by approximately 1500 nm.

Figure 10:
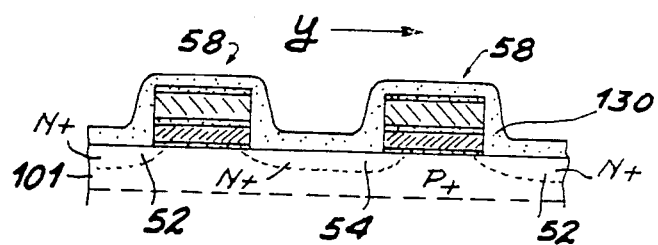

As shown in FIG. 10, this is followed by the elimination of the regions of the strips 113 of layers 110, 108, 106, 104 and optionally 102 not masked by mask 126.

This elimination can be carried out by successive anisotropic etchings of the reactive ionic type using different etching agents as a function of the nature of the layers. The silicon dioxide and silicon nitride layers can be etched with trifluoromethane, while the polycrystalline silicon layers are etched with sulphurhexafluoride. The stacks 58 (FIG. 2) of floating and control grids are then completed.

This is followed by a second etching of oxide layer 122, so as to only retain oxide in regions 128 located between two successive stacks in direction X and as shown in FIG. 9. This etching is performed anisotropically by reactive ionic etching using as the etching agent $CHF_3$ or $CF_4$. The lateral surface insulations are then completed. Finally, the resin mask 126 is eliminated by an oxygen plasma.

As shown in FIG. 10, sources 52 and drains 54 of the memory points are then produced by carrying out a doping of substrate 56 having a reverse conductivity to the latter. In the case of a p-type silicon substrate, said doping can be carried out by implanting arsenic ions at a dose of $5 \cdot 10^{15}$ ions/cm$^2$ and with an energy of 100 keV. This is followed by a heat treatment, e.g. at 850° C. for 30 minutes, in order to electrically activate the ions implanted in substrate 56.

This is followed by the deposition of a silicon oxide layer 130. This insulating layer e.g. has a thickness of 300 nm and can be deposited isotropically by a low pressure chemical vapor, phase deposition process.

Figure 11:
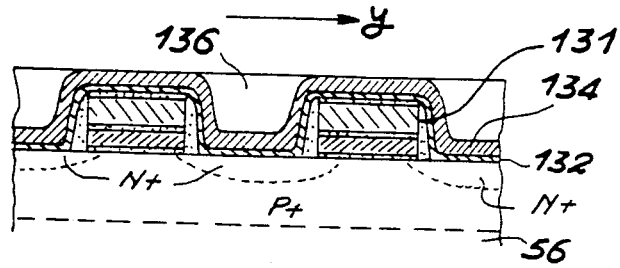

As shown in FIG. 11, this is followed by an etching of said layer 130, so as to only retain insulating strips, such a 131, on all the etched edges of the structure. These insulating strips 131 or spacers are particularly present all round the stacks of gates 58 of memory points and on either side of lateral surface insulations 128 (etched layer 122).

Said strips or spacers 131 are obtained by anisotropic etching, particularly of the reactive ionic type, in order to obtain spacers whose width is defined by the thickness of the isotropically deposited layer 130. In particular, a layer 130 with a thickness of 300 nm makes it possible to obtain 300 nm wide spacers 131.

The etching of insulating layer 130 is carried out without a resin mask (solid plate etching) using e.g. trifluoromethane.

The following stage of the first process consists of depositing one or two conductive layers on the complete structure and in which will be produced the different connections of the sources and drains of the memory cell. These layers can be of any random material generally used in the manufacture of integrated circuits (aluminium, tungsten, silicide, etc). The stack of conductive layers has a thickness less than that of stacks 58 and spacers 131, but is at least equal to 300 nm.

It should be noted that the smallest dimension of the sources and drains must not exceed roughly twice the thickness of said conductive stack, in order to ensure that during the subsequent etching of the latter, there is no etching of the zone of said stack which is directly in contact with the sources and drains. The smallest dimension of the sources and drains is between 1 and 2 micrometers in the present example.

In particular, these different connections can be defined in a single tungsten layer deposited by chemical vapor, phase deposition and having a thickness of 600 nm. Such a material makes it possible to reduce by a factor of at least 10 the square resistance of the sources and drains of the memory points. As shown in FIG. 11, they can also be defined in a stack of two layers 132 and 134 respectively made from a titanium and tungsten alloy (TiW) and aluminium.

The 100 nm thick TiW layer 32 can be deposited by magnetron sputtering. This layer serves to prevent aluminium diffusing into the underlying layers more particularly of silicon. Aluminium layer 134 can be deposited by magnetron sputtering and has a thickness of 400 nm.

This is followed by the deposition on the conductive layer or layers of an e.g. 1800 nm thick photosensitive resin layer 136. Optionally, said resin layer undergoes a heat treatment, e.g. baking at approximately 200° C. for 15 minutes, in order to bring about a good spreading thereof.

This followed by etching of the resin layer 136, so as only to retain the resin in the hollowed out relief parts of the structure. The resulting structure then has a planar surface, as shown in FIG. 11.

In the case of a stack of TiW 132 and aluminium 134 layers, this is followed by the elimination of the regions of layer 134 and then layer 132 not covered by resin 136. This elimination can take place by anisotropic etching of the reactive ionic etching type using carbon tetrafluoride as the etching agent for aluminium layer 134 and sulphurhexafluoride for the TiW layer 132. Layers 134 and 132 are etched by a thickness of approximately 500 nm below the etched stack 58 of layers 110, 108, 106, 104 and possibly 102, in order to subsequently prevent a short-circuit between the conductor lines 76, 78 on the on hand and 76, 80 on the other.

In the case of a single tungsten conductive layer, the latter is etched, as is the resin covering it over a thickness of approximately 500 nm below stack 58.

Connection 78, 80 between the sources on the one hand and the drains on the other of the memory points are then completed (FIG. 2).

Figure 12:
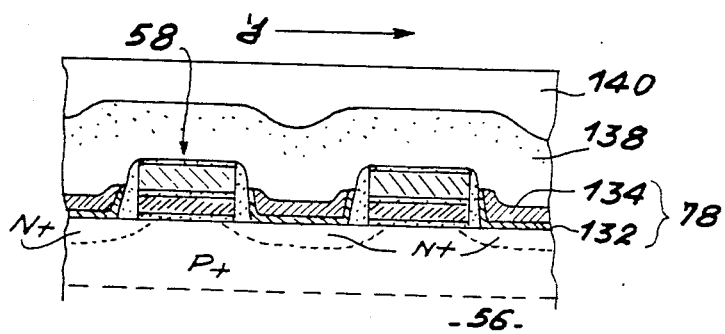

Following the etching of the conductive layer or layers, the remaining resin 136 is eliminated, e.g. using an oxygen plasma. The resulting structure is as shown in FIG. 12.

The use of a resin layer 136 as defined hereinbefore makes it possible to produce electric contacts and connections 70, 80 (FIG. 2) between the sources and drains of the different memory points, which are auto-positioned or auto-aligned with respect to the floating gate 62 and control gate 66 of said points.

Moreover, it makes it possible to considerably increase the integration density of the EPROM memories compared with the prior art, by eliminating the silicon dioxide layer 22 in which are formed electric contact holes 24 of the sources and drains of the prior art memory points and therefore eliminates the insulating guards 30.

This is followed by the deposition of a phosphorus-doped or undoped silicon dioxide layer 138 with a thickness of approximately 700 nm. Layer 138 can be deposited by low pressure chemical vapor phase deposition. Layer 138 is then covered with an approximately 1800 nm photosensitive resin layer 140. The heat treatment, e.g. heating to a temperature of 200° C. for 30 minutes makes it possible to obtain a good spreading of said resin layer 140.

Figure 13:
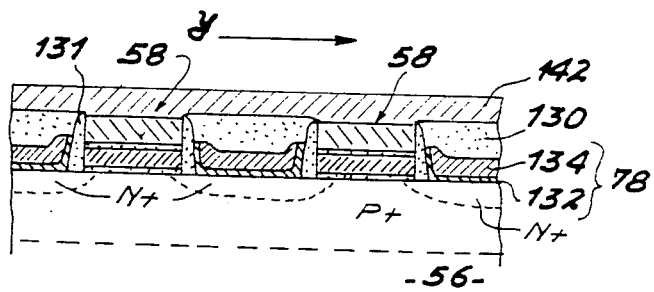

This is followed by the simultaneous etching of oxide layer 138 and resin 140, at identical etching speeds for the resin and the oxide until the top of stacks 58 is exposed. The structure obtained is as shown in FIG. 13.

Said etching is performed anisotropically using reactive ionic etching with fluorine agents ($CHF_3$ or $CF_4$) and oxygen. The fluorine compounds are used for etching the oxide and the oxygen for etching the resin.

The remainder of the nitride layer 110 exposed by reactive ionic etching is then eliminated by using $CHF_3$ as the etching agent. A metal layer 142, e.g. of aluminium is then deposited with a thickness of 800 nm on the complete structure. This aluminium layer can be deposited by magnetron sputtering.

Figure 14:
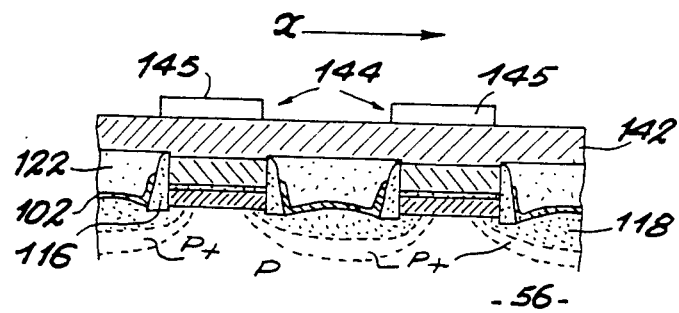

As shown in FIG. 14, a new photosensitive resin mask 144 defining the connection lines of the gates in direction Y, corresponding to the word lines is then produced. Mask 144 is in the form of strips 145 parallel to direction Y and is identical to mask 112.

Figure 15:
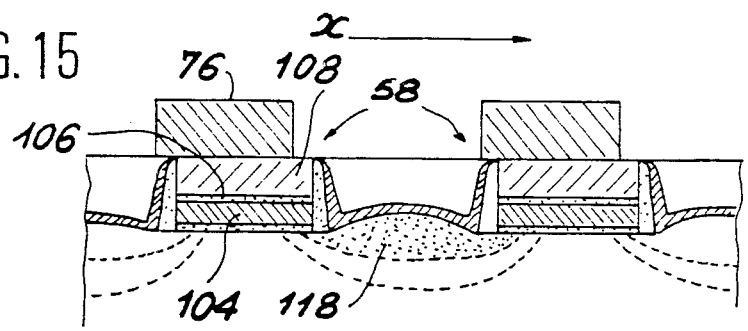

The unmasked regions of layer 142 are then eliminated. This can involve anisotropic etching of the reactive ionic type using carbon tetrachloride as the etching agent. The resulting structure is shown in FIG. 15. The lines of words or connections of the memory cell gates 76 are then completed. Resin mask 144 is then eliminated by $O_2$ plasma.

The final stage of the process consists of depositing a passivating, layer, generally of silicon dioxide on the complete structure.

The process according to invention as described hereinbefore makes it possible to obtain a quasi-planar structure. Moreover, as this process only requires three masking levels 112, 126 and 144, it is much simpler than the prior art processes, while none of the aforementioned stages is critical.

Figure 16:
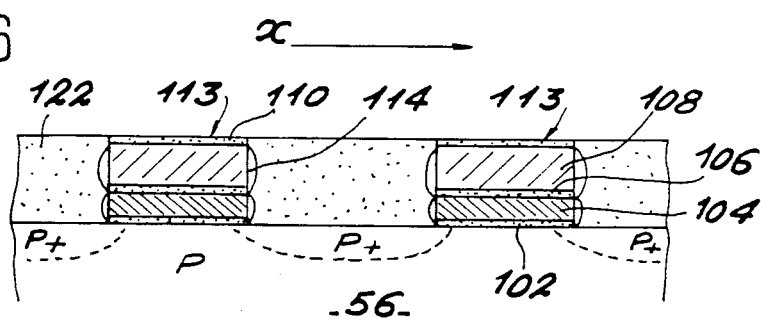
FIGS. 16 to 18 a variant of the process according to the invention, FIG. 16 being a sectional view in direction X and FIGS. 17 and 18 sectional views in direction Y of the memory cell.
Figure 17:
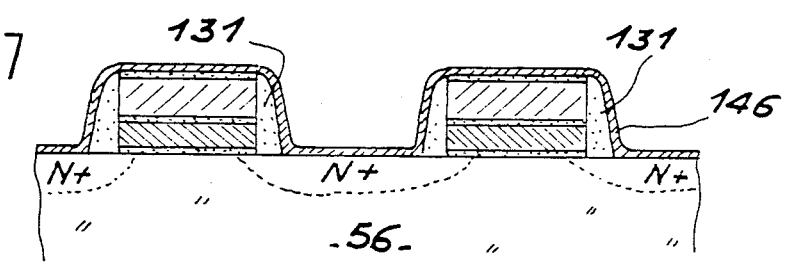
Figure 18:
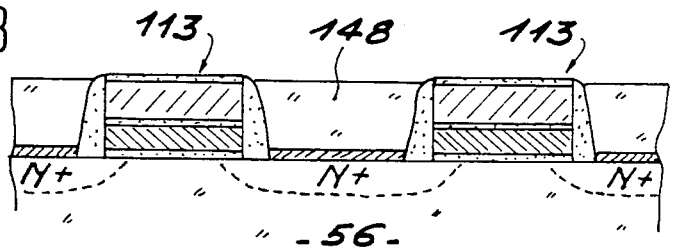

FIGS. 16 to 18 diagrammatically show a variant of the aforementioned process and which is due to the use of conductor line 78 for the bits in direction X made from silicide (tungsten, titanium, tantalum, platinum, molybdenum and similar silicides).

In this variant, directly after the oxidation 114 of the etched edges of strips 113 (stacks of layers 102, 110), there is a doping of the substrate, having the same type of conductivity as substrate 56, above which will be produced lateral insulations of the different memory points. This doping is carried out by implanting boron ions in the case of a p-type substrate at an energy of 80 keV and a dose of $10^{12}$ ions/cm$^2$. Thus, between strips 113 are obtained p+ regions 117.

Following said doping, the phosphorus-doped $SiO_2$ layer 122 is directly deposited in the manner shown in FIG. 16.

This variant of the process differs from that described relative to FIGS. 4 to 15 by the absence of the deposition of the nitride layer 116, its etching, its thermal oxidation for forming the field oxide 108 and the deposition of the silicon nitride layer 120.

After etching, as hereinbefore, of layer 122 simultaneously with the resin layer 24, the definition of the length of the channel of the memory points, the formation of sources 52 and drains 54 of said points and the formation of silicon dioxide spacers 131, in the manner shown in FIG. 17 a layer 146 of a metal able to form a silicide is deposited. This layer is e.g. an approximately 30 nm titanium layer deposited by magnetron sputtering.

The complete structure then undergoes annealing at a temperature of 600° C. for approximately 15 minutes and using a neutral gas atmosphere, such as nitrogen. This annealing makes it possible to form a silicide by reaction of the metal (titanium) with the silicon of the substrate 56. Obviously this chemical reaction is only possible if oxide layer 102 has previously been etched with the aid of mask 112 (FIG. 4).

This is followed by the elimination of those parts of layer 146 not in contact with the silicon and which are consequently not formed from silicide. The selective elimination of the titanium with respect to the titanium silicide is effected by a wet phase chemical process using a mixture of nitric and hydrofluoric acid ($HNO_3$ and HF).

This is followed by the deposition of an approximately 1000 nm borophosphosilicate glass insulating layer 148, which fulfills the same function as the silicon dioxide layer 138 in FIG. 12. This deposition of layer 148 takes place by chemical vapor, phase deposition. This is followed by a heat treatment of said layer 148 in order to bring about the flow and densification thereof, e.g. at a temperature of 850° C. for 30 minutes.

As previously, layer 148 is then covered with the resin layer 140 and is then etched simultaneously with said resin layer in order to only retain insulant 148 between the stacks of etched layers, as shown in FIG. 18.

The formation of the conductor lines 78 of the silicide bits makes it possible to obviate the deposition of resin layer 136, the simultaneous etching of said layer and the underlying conductive layer and the elimination of the remaining resin 136. Thus, this variant offers a certain number of simplifications, whilst the other process stages remain unchanged. In this variant, it is possible to reduce the thickness of the stack of etched layers 102–110, particularly by using a polycrystalline silicon layer 108 with a thickness of 600 nm instead of 1000 nm.

In the process described relative to FIGS. 4 to 15 and its variant described relative to FIGS. 16 to 18, the lateral insulations for bringing about the reciprocal insulation of the memory points are produced after defining (masking and etching) the length of the floating gates and control gates of said points.

With reference to FIGS. 19 to 23, a description will now be given of another process for the manufacture of an EPROM memory according to the invention, in which the lateral insulations are produced prior to defining the length of the floating and control gates. This description refers to a memory cell not having an insulating trench (FIG. 3). The material layers and the masks unchanged compared with those of the preceding process carry the same references.

In a type p monocrystalline silicon substrate 56, is firstly performed a doping thereof with a conductivity of the same type as the substrate and which will form the doping of the lateral insulations of said memory cell. This doping can be obtained by the implantation of boron ions, at an energy of 80 keV and a dose of $10^{12}$ ion/cm$^2$. It makes it possible to obtain a type p+ surface layer 151, as shown in FIG. 19.

This is followed by the deposition of an undoped silicon dioxide layer 152 using low pressure chemical vapor, phase deposition. Layer 152 has a thickness of approximately 2000 nm. In said insulating layer will subsequently be defined the lateral surface insulations between the memory points.

Using conventional photolithography processes, the resin mask 112 is then produced making it possible to define the length of the floating gates and control gates of the memory points, as well as those of the lateral insulations. Mask 112 is in the form of linear strips 111 which are parallel to one another and to direction Y of the memory cell. These strips of constant width are spaced by 1000 nm and have a width of 1000 nm.

As shown in FIG. 20, this is followed by the etching of insulating layer 152, which consists of eliminating those regions of the layer not masked by the resin. This is performed by anisotropic etching of the reactive ionic type using a CHF$_3$ plasma. Etching is performed over the entire thickness of layer 152. Thus, parallel insulating strips 153 are obtained, which will serve the function of a field oxide. Mask 112 is then eliminated by dissolving in ketone.

The gate oxide 154 is then formed between strips 153 and as shown in FIG. 20. Said oxide is formed by thermal oxidation at 900° C. of the exposed substrate regions. This gate oxide 154 has a thickness of 20 nm.

The formation of the gate oxide is followed by a doping of the substrate for adjusting the threshold voltage of the memory points. This doping with a conductivity of the same type as the substrate is obtained by implanting boron ions at a dose of 3·n$^{11}$ ions/cm$^2$ and an energy of 50 keV.

On the structure obtained is then deposited a phosphorus-doped polycrystalline silicon layer 156 by diffusion of POCl$_3$. This layer 156, deposited by chemical vapor, phase deposition, has a thickness of 250 nm and in it will subsequently be formed the floating gate of the memory points.

In known manner, is then deposited a photosensitive resin layer 158 cancelling out the relief of layer 156. This resin layer has a thickness of approximately 1500 nm. Its deposition can be followed by a heat treatment, e.g. heating at a temperature of approximately 200° C. for 30 minutes, to obtain a good spreading of the resin.

The resin layer 158 is then etched, so as to only retain resin in the hollowed out relief parts of the structure. The top of the remaining resin is approximately 700 nm below the top of the polycrystalline silicon layer 156. The resulting structure is shown in FIG. 21.

This is followed by the eliminations of the regions of the polycrystalline silicon layer 156 not covered with resin. This etching is performed anisotropically by a reactive ionic procedure using a sulphur hexafluoride plasma. Etching takes place over a thickness of 700 nm, so that the tops of the edge of the etched layer 156, rising on the edges of strips 153 are position below the tops of strips 153. This is followed by the elimination of the remaining resin by e.g. using an oxygen plasma. The resulting structure is shown in FIG. 22.

This is followed by the formation of the inter-gate insulant 160, which can be obtained by the thermal oxidation of the polycrystalline silicon of layer 156 at 900° C. and over a thickness of 25 nm, followed by the deposition of a 15 nm silicon nitride layer by CVD on the complete structure, followed by thermal oxidation at 900° C. of the surface of said nitride layer over a thickness of 5 nm.

On the complete structure is then deposited another polycrystalline silicon layer 162 which is phosphorus doped by POCl$_3$ diffusion, which fills all the space between the two insulating strips 153. This can be obtained by isotropic deposition, whose thickness is at least equal to half the inter-strip space (for insulating strips spaced by 1000 nm a CVD deposit of 500 nm is adequate). In the present case, layer 162 has a thickness of 800 nm and can be deposited by LPCVD.

As shown in FIG. 23, this is followed by solid plate etching of the silicon layer 162 (i.e. without mask), in order to free the top of the insulating strips 153. This etching is carried out anisotropically using a SF$_6$ plasma.

The process is continued by producing the second mask for defining the width of the channels of the memory points (FIG. 9). The subsequent stages are identical to those described relative to FIGS. 9 to 18. In particular, the inter-drain connection can be made from metal (FIG. 11) or silicide (FIG. 17).

In this process, the mask-free doping 151 of the substrate as the first stage, besides doping the lateral insulations, dopes the channel of the memory points. However, this is not prejudicial for the channels having a length equal to or less than 1000 nm because, for such lengths, there must be high doping of the channels. Moreover, the oxide layer 152 in which the lateral insulations are produced must not be doped in order to prevent an auto-doping of the gate insulant 154 obtain by thermal oxidation of the substrate.

Figure 24:
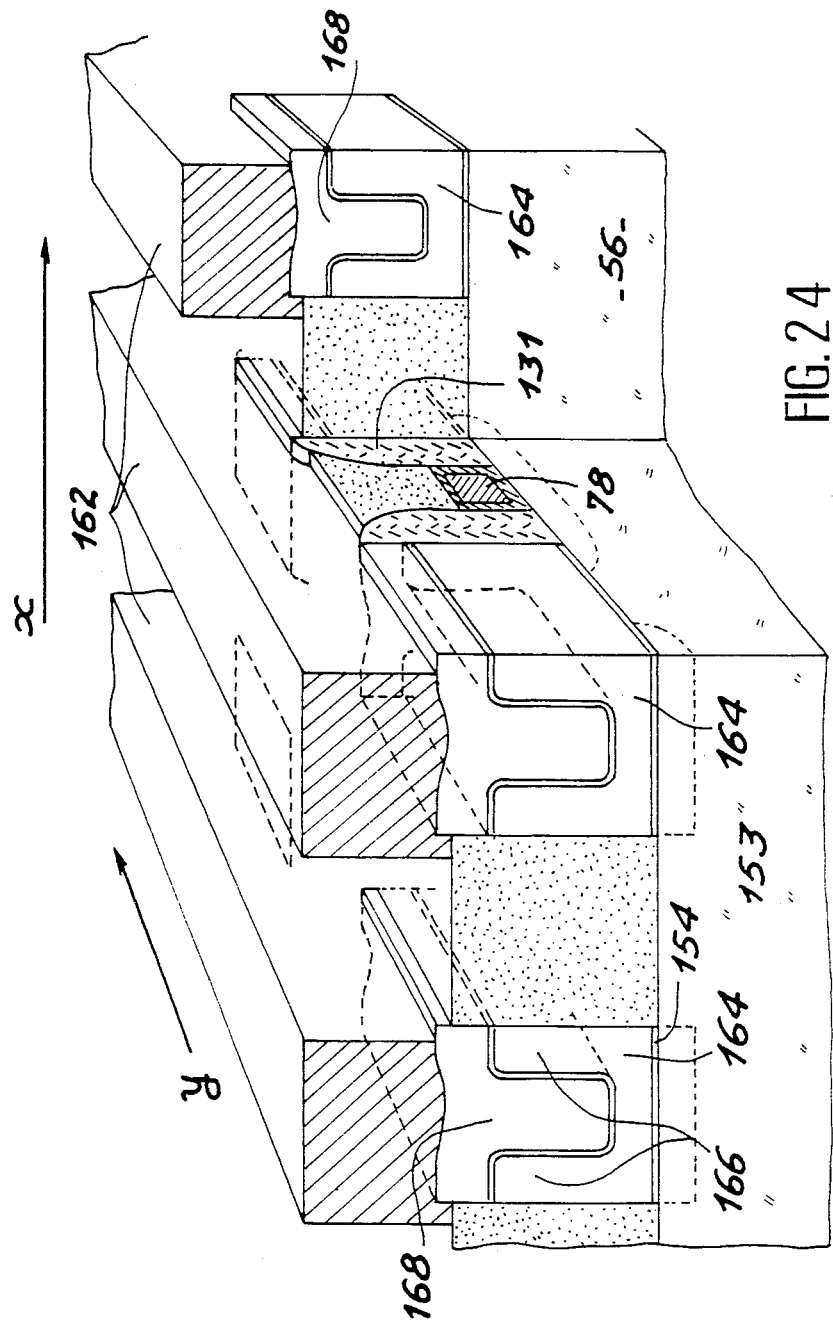
FIG. 24, in perspective the EPROM cell according the invention resulting from the process illustrated in FIGS. 19 to 23.

This process makes it possible to obtain an EPROM memory cell, like that shown in perspective in FIG. 24. Each memory point of this cell comprises a U-shaped floating gate, whereof the bottom is in contact with the gate insulant 154 and controls the length of the memory point channel. The edges 166 rising from said gate increase the coupling surface between floating gate 164 and control gate 168, which makes it possible to improve the capacitive coupling between control gate 168 and floating gate 164.

Compared with the memory cell shown in FIG. 2, this coupling improvement increases the efficiency of the memory cell during reading, but especially during writing into said cell. Obviously this memory cell can be equipped with insulating trenches, like those described relative to FIG. 3.

With reference to FIGS. 25 to 33 will now be described a variant of the aforementioned manufacturing process making it possible to obtain an EPROM memory cell with a dish-shaped floating gate, i.e. having the shape of a U in two perpendicular directions X and Y. The layers of materials and masks unchanged with respect to those described in FIGS. 19 to 23 carry the same references.

Figure 25:
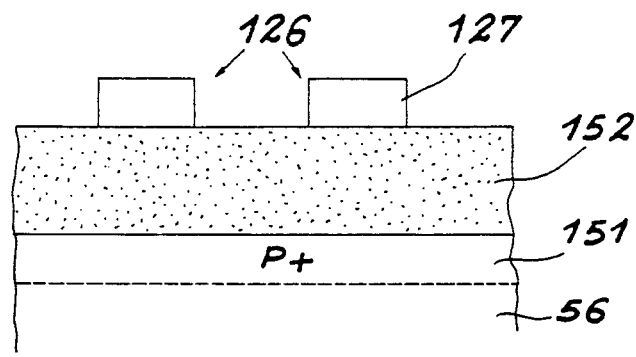
FIGS. 25 to 33, diagrammatically the different stages in the manufacture of an EPROM memory cell according to a constructional variant.

After carrying out the p+-type doping 151 in the monocrystalline silicon substrate 56, the lateral insulations of said memory cell and the deposition of the SiO$_2$ layer 152, resin mask 126 is produced by photolithography, cf FIG. 25, it serving to define the length of the channels of the memory points, as well a the width of the lateral insulations. Mask 126 is in the form of linear strips 127, which are parallel to one another and to the direction X of the cell. These strips have a sicth of 1400 nm and are spaced by 100 nm.

Figure 26:
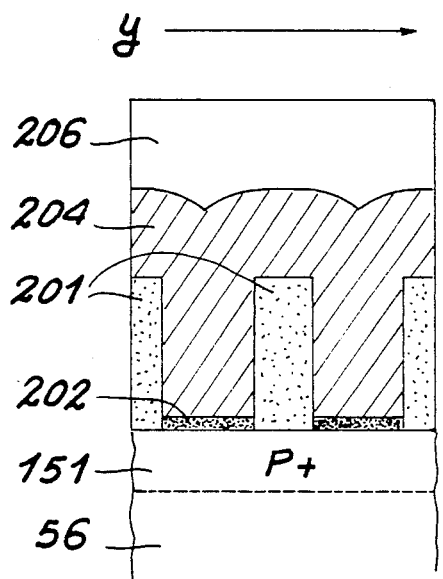

This is followed by an anisotropic etching of layer 152 consisting of eliminating those regions of said layer not masked by resin. This is brought about by reactive ionic etching using a CHF$_3$ plasma over the entire thickness of layer 152. This gives insulating strips 201, which are parallel to one another and to the direction X, as shown in FIG. 26.

Following the elimination of mask 126 with a O$_2$ plasma, there is a thermal oxidation of the source and drain regions of the substrate which have been exposed. Oxide layer 202 has a thickness of 25 nm.

This is followed by the deposition of a layer 204 of a material which can be selectively etched with respect to strips 201 and e.g. an undoped polycrystalline silicon layer deposited by CVD, which has a thickness of 1000 nm and which is followed by the deposition of a planarization resin layer 206 with a thickness of approximately 500 nm. This deposition can be followed by a heat treatment consisting of heating at 200° C. for 30 minutes, in order obtain a good spreading of the resin.

This is followed by the simultaneous etching of silicon layer 204 and resin layer 206 at identical etching speeds for resin and silicon until the top of the insulating strips 201 is exposed. The structure obtained is that shown in FIG. 27. Etching is carried out anisotropically by reactive ionic etching using fluorine agents such as SF$_6$ for silicon and oxygen for the resin.

Figure 27:
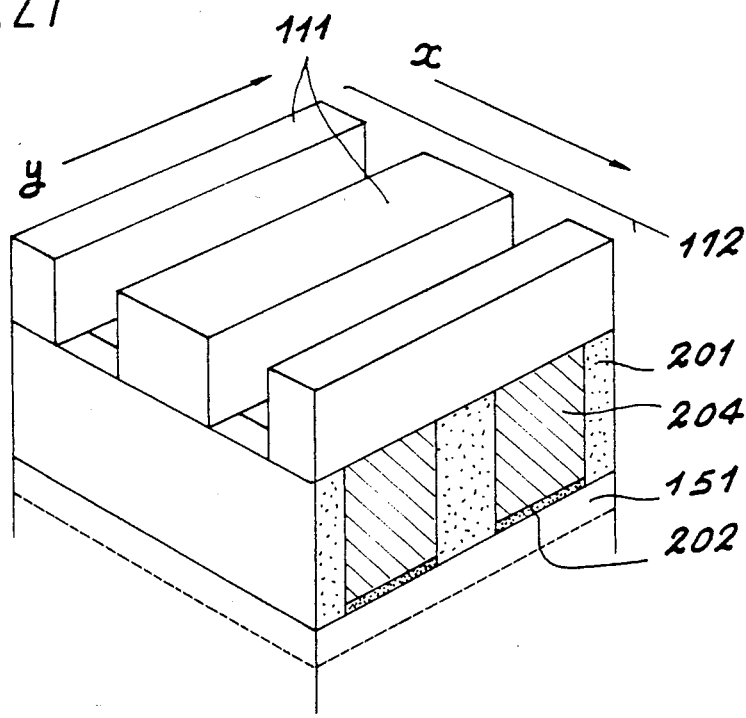

This is followed by the conventional photolithographic production of the resin mask 112 shown in FIG. 27 and defining the length of the lateral insulations and the width of the channel of the memory points. This mask comprises linear strips 111 parallel to the direction Y of the cell, spaced by 1000 nm and having a width of 1400 nm.

Figure 28:
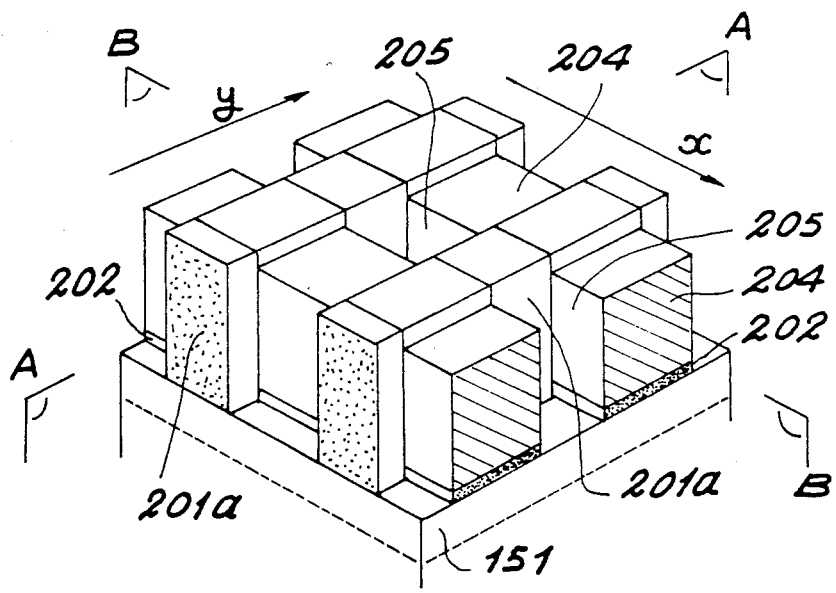

This is followed by the etching of insulating strips 201, which consists of eliminating those regions of said strips which are not masked by the resin. This etching is an isotropic etching process of the reactive ionic type using a CHF$_3$ plasma and is performed over the entire thickness of strips 201. This leads to SiO$_2$ spots 201a inserted between two undoped polycrystalline silicon strips 204 in direction Y and as shown in FIG. 28. In direction X, there is an alternation of spots 201a and holes 205, in which will subsequently be formed the dish-shaped floating gate of the memory points and their control gate. At this production stage, spots 201a and strips 204 have the same height.

Following the elimination of resin mask 112 by a O$_2$ plasma, there is optionally as thermal oxidation at 900° C. of the exposed silicon substrate regions 56 (bottom of holes 205) and of the silicon forming strips 204 over a thickness of approximately 25 nm. This "sacrificial" insulating layer is not shown in the drawings. This is followed by the etching of said oxide layer using reactive ionic etching and a CHF$_3$ plasma, which leads to the structure shown in FIG. 28, in which spots 201a are higher than the silicon strips 204. The height displacement is approximately 25 nm.

This is followed by a thermal oxidation of the exposed substrate regions and of the silicon of strips 204 at 900° C. and over a thickness of approximately 20 nm. The layer obtained carries reference 206 and constitutes the gate oxide of the memory points on substrate 56.

The formation of oxide layer 206 is followed by an implantation of ions of the same conductivity as that of the substrate, in order to define the channel of the memory points. This is obtained by implanting boron at a dose of $3 \cdot 10^{11}$ ions/cm$^2$ and an energy of 50 keV.

As described hereinbefore with reference to FIGS. 20 to 23, this is followed by the deposition of the n+-doped polycrystalline silicon layer 156 by the diffusion of phosphorus in the form of POCl$_3$. This CVD-deposited layer 156 having a thickness of 250 nm will be used for the subsequent production of the floating gate of the memory points.

Figure 29:
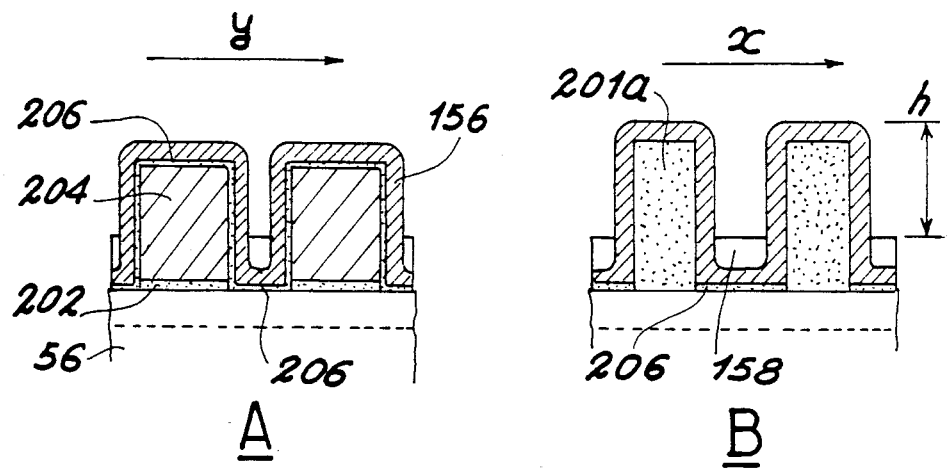
Figure 30:
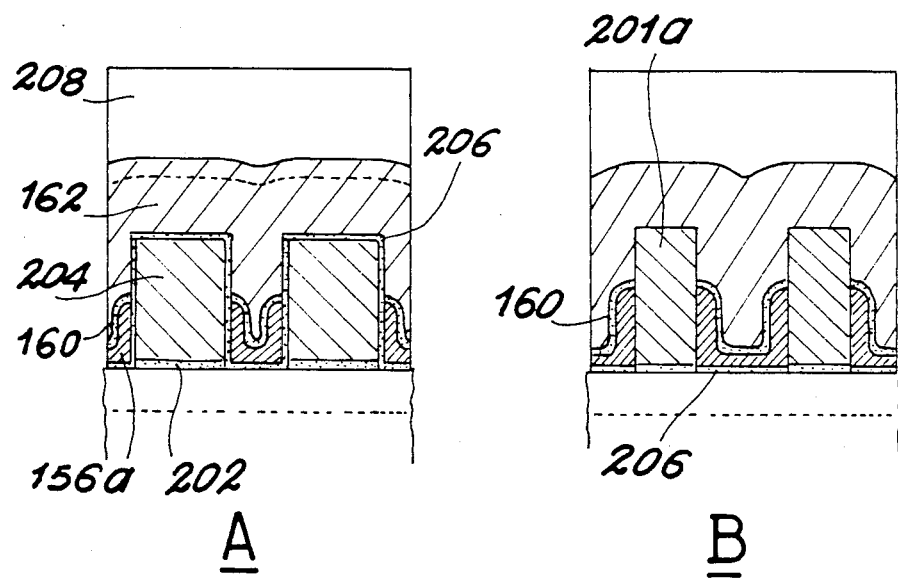

Following the deposition of the so-called planarization photosensitive resin layer 158 with a thickness of 1500 nm and which is optionally annealed, said resin layer is etched so as only to retain resin in the hollowed out relief parts of the structure, as shown on parts A and B in FIG. 29. Height h separating the resin and the silicon 156 is approximately 1000 nm.

Under the same conditions as hereinbefore, there is then an elimination of those regions of layer 156 not covered by resin using anisotropic etching with SF$_6$, followed by the elimination of the remaining resin 158. The resulting structure is shown in parts A and B of FIG. 30. The floating gates 156a of the memory points are then completed.

This is followed by the production of the inter-gate insulant 160 formed from a three-layer material SiO$_2$/Si$_3$N$_4$/SiO$_2$ with respective thicknesses 25, 15 and 5 nm. This is followed by the depositing second polycrystalline silicon layer 162, which is doped with phosphorus by diffusion of POCl$_3$ using LPCVD. This 1000 nm thick layer 162 will subsequently serve for the production of the control gate of the memory points.

A 500 nm thick photosensitive resin layer 208 is then deposited to obtain a planar structure. This is optionally followed by a heat treatment at 200° C. for 30 minutes.

This is followed by the simultaneous etching of silicon layer 162 and resin layer 208 until the top of the SiO$_2$ spots 201a appear. The etching is of the reactive ionic type using a plasma of SF$_6$ and O$_2$ for respectively etching the polycrystalline silicon and the resin.

Figure 31:
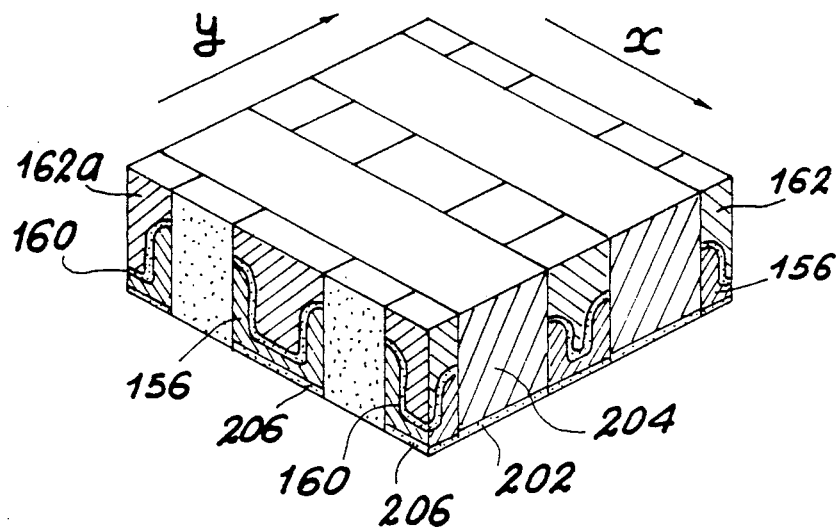

This etching also make it possible to eliminate those regions of the SiO$_2$ layer 206 not covered by the integrate insulant 160 (located on strips 204), as well as the elimination of the top of the oxide spots 201a. This leads to a planar structure as shown in FIG. 31. The control gates 162a of the memory points are then finished.

Figure 32:
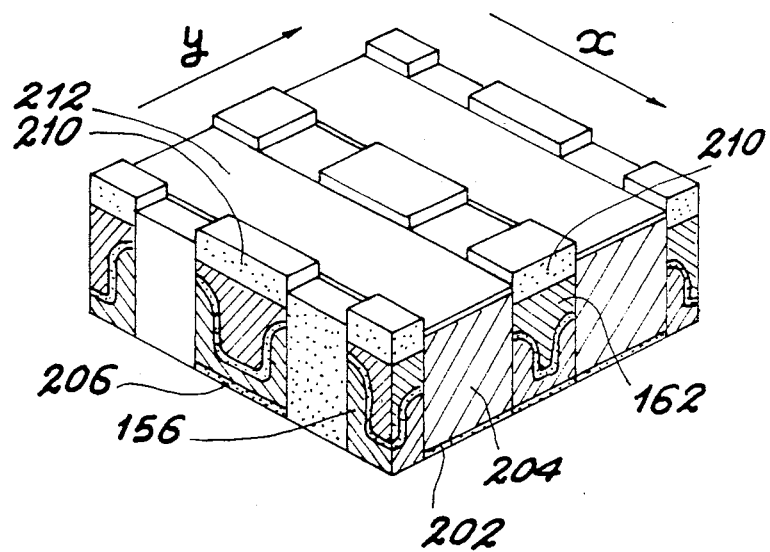

There is then a differential thermal oxidation of the doped polycrystalline silicon 162 and the undoped polycrystalline silicon 204. This oxidation takes place under water vapor at 850° C. for one hour, which makes it possible to grow approximately 200 nm of oxide 210 on the doped polycrystalline silicon 162 and only 50 nm of oxide 212 on the undoped polycrystalline silicon 204, as shown in FIG. 32. The obtaining of a thicker oxide layer on the doped silicon 162 is due to the fact that the latter oxidizes four times faster than the undoped silicon 204.

Figure 33:
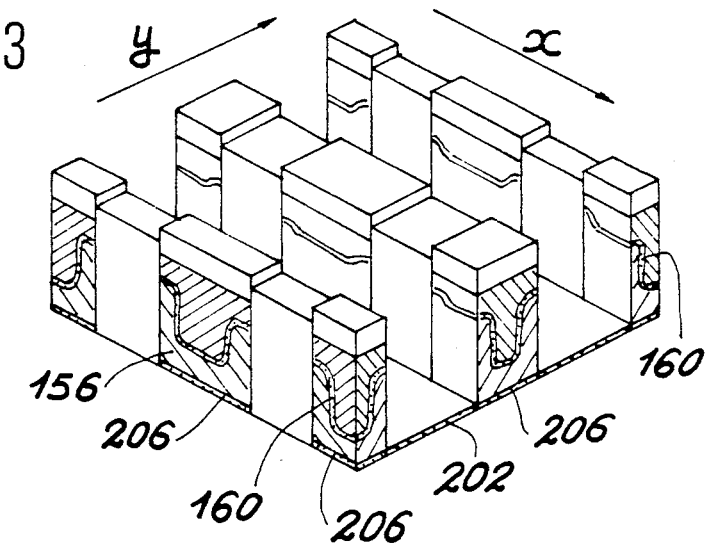

This is followed by a mask-free etching of the oxide formed over a thickness of 50 nm by reactive ionic etching with CHF$_3$, which in particular brings about the elimination of the oxide 212 surmounting the undoped silicon 204. This is followed by the elimination of the undoped polycrystalline silicon 204 by selective reactive ionic etching using a plasma of SF$_6$ under "high pressure" of e.g. 130 Pa (1 torr). The structure obtained is shown in FIG. 33.

This process continues as hereinbefore by the deposition of oxide layer 130 in which will be formed the spacers 131 (FIG. 11). Moreover, the etching of said layer 130 makes it possible to eliminate the insulant 202 located on the zones of the sources and drains. The subsequent stages are identical to those described relative to FIGS. 12 to 18.

This process makes it possible to obtain an EPROM memory cell in which the floating gates 156a are shaped like a U, both in direction Y and in direction X of the cell. This dish shape of the floating gate considerably improves the coupling between floating gate 156a and control gate 162a of each memory point, thus improving the electrical properties of the memory cell.

Obviously, this dish-shaped floating gate memory cell can be equipped with insulating trenches, like those described relative to FIG. 3.

The above description has only referred to the manufacture of the memory cell (or the actual memory) of an EPROM memory. Obviously the production of peripheral control cells for the memory located in the same plane as the memory cell require the use of photolithographic resin masks different from those described hereinbefore, but said masks are not critical.

The above description has clearly only been given in an exemplified manner and any modification can be made thereto without passing beyond the scope of the invention.

In particular, it is possible to modify the thickness of the different layers, replace the silicon dioxide insulating layers by silicon nitride layers, replace the n$^+$-doped polycrystalline silicon conductive layers (particularly by phosphorus) by p$^+$-doped polycrystalline silicon layers (e.g. boron) or to use other conductive materials, such as refractory materials or silicides.

In the same way, it is possible to replace the reactive ionic etching operations by other wet or dry etching processes generally used in microelectronics. For example, for layers made from materials which are difficult t etch, which is e.g. the case with copper or silver, ionic machining operations are possible.

It is also possible to produce an EPROM memory on a semiconductor substrate other than of silicon (e.g. GaAs or InP), it also being possible to use a n-doped substrate. In the case of a n-doped silicon substrate, the boron doping processes must be replaced by arsenic or phosphorus doping processes and conversely the arsenic or phosphorus doping processes must be replaced by boron doping processes.

Moreover, as stated hereinbefore, the invention applies to any integrated circuit having a plurality of MIS transistors, which are not necessarily distributed in matrix form and whereby each has either a control gate and a floating gate, or solely a control gate. The invention is particularly suitable for non-volatile memory cells other then EPROM, such as EEPROM, REPROM and ROM, said memories generally having the same organization (addressing) as EPROM memories.

Figure 34:
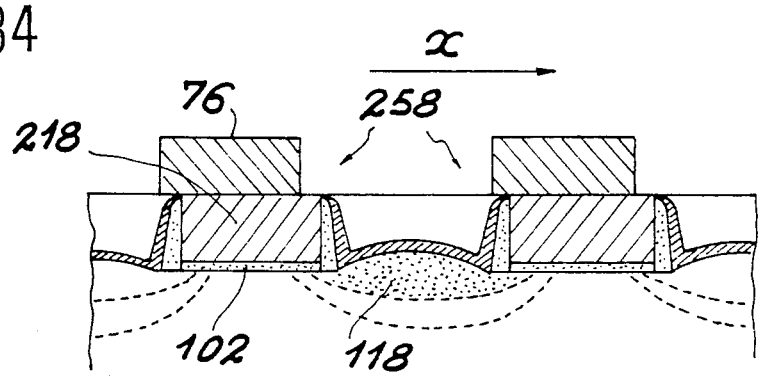
FIGS. 34 and 35 diagrammatically, two embodiments of MOS transistors according to the invention.
Figure 35:
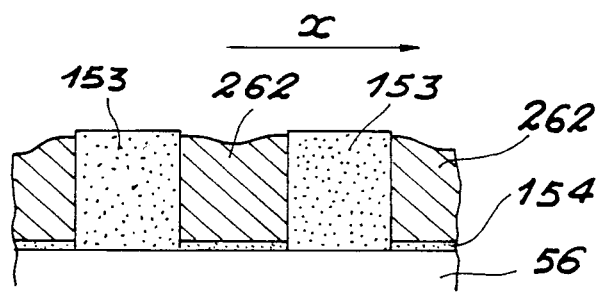

To this end, FIGS. 34 and 35 show MOS transistors according to the invention not having a floating gate (e.g. ROM). FIGS. 34 and 35 are respectively comparable with FIGS. 15 and 23.

FIG. 34 differs from FIG. 15 by the absence of insulating layer 104 and the short-circuiting of layers 106 and 108 and therefore the presence of a single polycrystalline silicon conductive layer 218 constituting the transistor gate. This corresponds to the elimination of the inter-gate insulant and the floating gate.

Reference 258 corresponds to the stack of the gate insulant 102 and the gate 218.

The manufacture of the MOS transistor is identical to that of the EPROM memory cell (FIGS. 4 to 15) with the exception of the deposition and etching of a single approximately 1300 nm thick, phosphorus-doped polycrystalline silicon layer 218 in place of the successive depositions and etchings of the layers 104, 106 and 108.

In the case of a matrix of transistors, every other transistor can be equipped with an insulating trench, as described relative to FIG. 3.

In the same way, FIG. 35 differs from FIG. 23 by the absence of insulating layer 160 and the replacement of the conductive layers 156 and 162 by a single polycrystalline silicon layer 262 constituting the transistor gate. Apart from the etchings and depositions of the stacks of gates, the manufacture of this transistor is identical to that described relative to FIGS. 19 to 23.

What is claimed is:

1. A process for the manufacture of an integrated circuit on a semiconductor substrate having (a) a group of transistors electrically insulated from one another by lateral insulations, each transistor including a control gate made from a first conductive material, a source and drain located on either side of the control gate, the control direction passing from the source to the drain being a first direction Y, and (b) first, second and third conductor lines for applying first, second and third electrical signals to the gates, sources and drains respectively, said process comprising the steps of applying said first conductive material (108, 218, 162, 262) to the substrate prior to the formation of the sources and drains therein;

simultaneously defining the length of said lateral insulations and control gates with a first mask pattern (112) formed from strips (111) extending parallel to said first direction Y;

defining simultaneously the width of said lateral insulations and control gates with a second mask pattern (126) formed from strips (127) extending perpendicular to said first direction Y;

following formation of said sources and drains in said substrate, forming said second and third conductor lines extending perpendicular to said first direction Y;

following an electrical insulating of said second (78) and third (80) conductor lines, applying a second conductive material (142) to the substrate; and defining said first conductor lines (76) by masking said second conductive material with a third mask pattern (144) formed from strips (145) extending parallel to the first direction Y whereby said first conductor lines also extend parallel to said first direction Y.

2. A manufacturing process according to claim 1, wherein the first, second and third masks are in each case formed from linear strips having a constant width which are equidistant.

3. A manufacturing process according to claim 1, comprising the following stages:

(1) successive covering of the substrate by a layer (102) of a first insulating material and a layer (248) of said first conductive material, (2) production of the first mask pattern (112), (3) elimination of the regions of the first conductive and eventually first insulating materials not masked by the strips (111) of said first mask pattern and thus forming first strips (113) parallel to said first direction, (4) elimination of the first mask pattern, (5) filling the spaces defined between the first strips by a second insulating material (118, 122, 148) constituting the lateral insulations, (6) production of the second mask pattern (126), (7) elimination of the regions of the second insulating, said first conductive and eventually first insulating materials, not masked by the strips (127) of said second mask pattern and thus forming second strips (158-128) perpendicular to the first direction, (8) production of sources (52) and drains (54) by a first doping of the substrate having a reverse conductivity to that of the substrate, (9) elimination of the second mask pattern,

(10) production of insulating spacers (131) on either side of the second strips and joined to said second strips,

(11) production of second (78) and third (80) conductor lines in the spaces defined between the spacers, the height of the second lines being left from that of the second strips and the spacers,

(12) covering the second and third conductor lines by a third insulating material (138) level with the top of the second strips,

(13) deposition of a layer (142) of the second conductive material over the entire structure obtained in step (12)

(14) production of the third mask pattern (144),

(15) elimination of the regions of the second conductive material not masked by the strips (148) of said third mask pattern, thus forming the first conductor lines (76) and,

(16) elimination of the third mask pattern.

4. A manufacturing process according to claim 3, wherein there is a second doping of the substrate with the same type of conductivity as that of the substrate, following the first insulating material covering of the substrate and in order to define the doping of the channels.

5. A manufacturing process according to claim 3, wherein during step (1) a layer (110) of a fourth insulating material is deposited on the first conductive material (218) and wherein said fourth material layer is etched during steps (3) and (7).

6. A manufacturing process according to claim 3, characterized in that between stages (4) and (5), the top and etched edges of the first strips are covered with a fifth insulating material (116) and wherein the substrate located between said etched edges is thermally oxidized, the substrate being made from silicon.

7. A process according to claim 1, wherein the first conductor lines (76) are made from metal.

8. A process according to claim 1, wherein the first conductor lines (76) are made from aluminum.

9. A process according to claim 1, wherein the second (78) and third (80) conductor lines are made from metal or a silicide of a refractory metal.

10. A process according to claim I, wherein the second (78) and third (80) conductor lines are made from tungsten.

11. A process according to claim 1, applied to the manufacture of a memory integrated on a semiconductor substrate comparing (a) a group of memory cells (50) electrically insulated from one another by lateral insulations, each memory cell having a first stack of at least one first floating gate and one second control gates, the first and second gates of each memory cell having the same width and the same length, which are stacked and insulated from one another, a source and a drain located on either side of the gates and a channel located beneath the gates, (b) first conductor lines for applying first electric signals to the control gates, (c) second conductor lines for applying second electric signals to the drains and (d) third conductor lines for applying third electric signals to the sources, said process comprising the following steps:

(1) successive coverings of the substrate (56) by a layer (102) of a first insulating material, a layer (104) of a third conductive material, a layer of a second insulating material and a layer (108) of said first conductive material, (2) production of the first mask pattern (112), (3) elimination of the regions of the first conductive, second insulating, third conductive and eventually first insulating materials not masked by the strips (111) of said first mask pattern, thus forming first strips (113) parallel to said first direction (Y), (4) elimination of the first mask pattern, (5) filling the spaces defined between the first strips with a third insulating material (118, 122, 148) constituting the lateral insulations, (6) production of the second mask pattern (126), (7) elimination of the regions of the third insulating, first conductive, second insulating, third conductive and eventually first insulating materials not masked by the strips (127) of the second mask, thus forming second strips (58-128) perpendicular to the first direction, (8) production of the sources (52) and drains (56) by a first doping of the substrate having a conductivity which is the opposite to that of the substrate, (9) elimination of the second mask pattern,

(10) production of insulating spacers (131) on either side of the second strips and joined to said second strips,

(11) production of second (18) and third (80) conductor lines in the spaces defined between the spacers, the height of the second lines being less than that of the second strips and the spacers,

(12) covering the second and third conductor lines by a fourth insulating material (142) level with the top of the second strips,

(13) deposition of a layer (142) of the second conductive material on the entire structure obtained,

(14) production of the third mask pattern (144),

(15) elimination of the regions of the second conductive material not masked by the strips (145) of the third mask, thus forming first conductor lines (76) and,

(16) elimination of the third mask pattern.

12. A process according to claim 1 comprising the following steps:

(I) deposition of a layer (152) of a first insulating material on the complete substrate (56) for forming the lateral insulations, (II) production of the first mask pattern (112), (III) elimination of the regions of the first insulating material not masked by the strips (111) of the first mask, thus forming first strips (153) parallel to said first direction (Y), (IV) elimination of the first mask pattern, (V) production of a second insulating material (154) between the first strips, (VI) deposition on the second insulating material of the first conductive material (262), the height of the stack of the second insulating and first conductive materials being close to that of the first strips (153), (VII) production of the second mask pattern (126), (VIII) elimination of the regions of the first conductive and eventually second insulating materials not masked by the strips (127) of the second mask, thus forming second strips (58-128) perpendicular to the first direction, (IX) production of sources (52) and drains (54) by a first doping of the substrate having a reverse conductivity to that of the substrate, (X) elimination of the second mask pattern, (XI) production of insulating spacers (131) on either side of the second strips and joined to said second strips, (XII) production of second (78) and third (80) conductor lines in the spaces defined between the spacers, the height of the second lines being less than that of the second strips and the spacers, (XIII) covering the second and third conductor lines by a third insulating material (138) level with the top of the second strips, (XIV) deposition of a layer of said second conductive material (142) on the entire structure obtained, (XV) production of the third mask pattern (144), (XVI) elimination of the regions of the second conductive material not masked by the strips (145) of the third mask, thus forming the first conductor lines (76) and, (XVII) elimination of the third mask pattern.

13. A process according to claim 1, applied to the manufacture of a memory integrated on a semiconductor substrate comprising (a) a group of memory cells (50) electrically insulated from one another by lateral insulations, each memory cell incorporating a first stack of at least one floating gate and a second control gate, which are stacked and insulated from one another, the floating and control gates of each memory cell having the same width and the same length, a source and a drain located on either side of the gates and a channel positioned beneath the gates, (b) first conductor lines for applying first electric signals to the control gates, (c) second conductor lines for applying second electric signals to the drains and (d) third conductor lines for applying third electric signals to the sources, said process comprising the following steps:

(I) deposition of a first layer (152) of a first insulating material on the complete substrate (56) for forming lateral insulations, (II) production of the first mask pattern (112), (III) elimination of the regions of the first insulating material not masked by the strips (111) of the first mask, thus forming first strips parallel to said first direction, (IV) elimination of the mask pattern, (V) production of a second insulating material (154) between the first strips, (VI) successive depositions on the second insulating material of the first conductive material (156), of a third insulating material (160) and a third conductive material (162), the height of the stack of the second insulating, first conductive, third insulating, and third conductive materials being close to that of the first strips, (VII) production of the second mask pattern (126), (VIII) elimination of the regions of the third conductive, third insulating, first conductive and eventually second insulating materials not masked by the strips (127) of the second mask, thus forming second strips (58-128) perpendicular to the first direction.

(IX) production of sources (52) and drains (54) by a first doping of the substrate having a reverse conductivity to that of the substrate, (X) elimination of the second mask pattern, (XI) production of insulating spacers (131) on either side of the second strips and joined to said second strips, (XII) production of second (148) and third (80) conductor lines in the spaces defined between the spacers, the height of the second lines being less than that of the second strips and the spacers, (XIII) covering the second and third conductor lines by a fourth insulating material (138) level with the top of the second strips, (XIV) deposition of a layer of said second conductive material (142) over the entire structure obtained, (Xv) production of the third mask pattern (144), (XVI) elimination of the regions of the second conductive material not masked by the strips (145) of the third ask, thus forming the first conductor lines (76) and, (XVII) elimination of the third mask pattern.

14. A process according to claim 11 or 13, wherein the first gate is shaped like a U at least in a section perpendicular to the first direction (Y).

15. A process according to claim 1, applied to the manufacture of a memory integrated on a semiconductor substrate having (a) a plurality of memory cells electrically insulated from one another by lateral insulation, each memory cell having a first stack of at least one first floating gate and a second control gate in stacked form and insulated from one another, the first and second gates of each memory cell having the same width and the same length, a source and a drain located on either side of the gates and a channel positioned beneath the gates, (b) first conductor lines for applying first electric signals to the control gates, (c) second conductor lines for applying second electric signals to the drains and (d) third conductor lines for applying third electric signals to the sources, said process comprising the following steps:

(A) production of a layer (152) of a first insulating material on the composite substrate for forming the lateral insulations, (B) production of the second mask pattern (126), (C) elimination of the regions of the first insulating material not masked by the strips (127) of the second mask, thus forming first strips (201) perpendicular to said first direction (Y), (D) elimination of the second mask pattern, (E) deposition of an intermediate material (204) between the first strips (201) which can be selectively etched with respect to the first insulating material (152), (F) production of the first mask pattern (112), (G) elimination of the regions of the first insulating material not masked by the strips (111) of the first mask, thus forming second strips (201a-204) parallel to said first direction (Y), (H) elimination of the first mask pattern, (I) deposition of a second insulating material (206) between the second strips, (J) successive depositions between the second strips of a third conductive material (156), a third insulating material (160) and the first conductive material (162), the height of the stack of the second insulating, third conductive, third insulating and first conductive materials being close to that of the second strips (201a–204), (K) elimination of the intermediate material (204), (L) production of source (52) and drains (54) by a first doping of the substrate with a reverse conductivity to that of the substrate, (M) production of insulating spacers (131) on either side of the second strips and joined to said second strips, (N) production of second (78) and third (80) conductor lines in the spaces defined between the spacers, the height of the second lines being less than that of the second strips and the spacers, (O) covering the second and third conductor lines by a fourth insulating material (138) level with the top of the second strips, (P) deposition of a layer of said second conductive material (142) on the entire structure obtained, (Q) production of the third mask pattern (144), (R) elimination of the regions of the second conductive material not masked by the strips (145) of the third mask, thus forming the first conductor lines (16) and, (S) elimination of the third mask pattern.

16. A manufacturing process according to claim 12, 13 or 15 wherein on the complete structure is deposited a layer of the first conductive material (162, 262) and wherein said layer is etched until the top of the first strips (153) is exposed, so that the first conductive material is only obtained above the second insulating material (154).

17. A process according to claim 11, 13 or 15, wherein the first and second gates of the memory cells do not extend above the lateral insulations serving to electrically insulate the memory cells from one another.

18. A process according to claim 11, 13 or 15, wherein second stacks (82) are formed simultaneously to the first stacks, each second stack being formed by a fifth insulant (84) in contact with the substrate, a fourth (86) and fifth (90) conductive materials separated from one another by a sixth insulating material (88), the fourth conductive material being in contact with the fifth insulant, each second stack being inserted between two memory cells in the first direction (Y), an insulating trench (92) formed in the substrate being provided beneath each second stack (82).

19. A manufacturing process according to claim 1, wherein, as the substrate is made from silicon and has exposed regions, the step of producing the second conductor lines (76) comprises the following operations:

deposition on the complete structure of a layer (146) of an additional material able to form a silicide, thermal annealing of the assembly in order to react said additional material directly in contact with the exposed substrate regions in order to locally form a silicide and, elimination of the additional material which has not reacted with the substrate.

20. A manufacturing process according to claim 1, wherein the stage of producing the second conductor lines (76) comprises the following operations:

deposition of a layer of at least one fourth conductive material (132, 134) on the complete structure, deposition on the entire fourth conductive material of a resin layer (136) eliminating the relief of the fourth conductive material, optionally heat treatment of the resin layer, etching the resin layer so as to only leave behind resin in the hollowed out relief parts of the fourth conductive material, elimination of the regions of the fourth conductive material not covered with resin, and elimination of the remaining resin layer.

21. A manufacturing process according to claim 20, wherein the fourth material layer is formed from a TiW layer covered with an aluminium layer.

22. A manufacturing process according to claim 1, wherein beneath the lateral insulations is performed a third doping of the substrate having the same type of conductivity as the substrate.

23. A process according to claim 11 or 13, wherein the first gate in a section perpendicular to the first direction (Y) and in a section parallel to the first direction (Y) is shaped like a U.

* * * * *